US006853185B2

(12) United States Patent
Tsukamoto et al.

(10) Patent No.: US 6,853,185 B2
(45) Date of Patent: Feb. 8, 2005

(54) MAGNETIC FIELD MEASUREMENT SYSTEM

(75) Inventors: Akira Tsukamoto, Saitama (JP); Koichi Yokosawa, Kokubunji (JP); Daisuke Suzuki, Kodaira (JP); Akihiko Kandori, Kokubunji (JP); Keiji Tsukada, Okayama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/844,480

(22) Filed: May 13, 2004

(65) Prior Publication Data

US 2004/0232912 A1 Nov. 25, 2004

(30) Foreign Application Priority Data

May 19, 2003 (JP) ........................................ 2003-139754

(51) Int. Cl.⁷ ........................ G01R 33/035; G01R 33/02
(52) U.S. Cl. ...................................... 324/248; 324/210
(58) Field of Search ................................. 324/247–248, 324/256–258, 260–261, 243–244, 210–212; 505/845–846

(56) References Cited

U.S. PATENT DOCUMENTS 4,788,504 A * 11/1988 Blanpain et al. ............ 324/377

FOREIGN PATENT DOCUMENTS

JP 10-305019 11/1998

OTHER PUBLICATIONS

Physica C 378–381, 2002, K. Saukta et al, pp. 1391–1395.

Proceedings of Biomag, 2000, Pizzella et al, pp. 939–942.

* cited by examiner

Primary Examiner—Bot LeDynh
(74) Attorney, Agent, or Firm—Mattingly, Stanger & Malur, P.C.

(57) ABSTRACT

A magnetic field measurement system for canceling an external field is provided, in which plurality of sensing magnetometers (3) for measuring a magnetic field signal in a direction perpendicular to the center axis of a cylindrical magnetic shield (1) are arranged in two dimensions on a plane parallel to the center axis and a reference magnetometer (4) for measuring the external field parallel to the center axis as a reference signal is disposed on a plane perpendicular to the plane parallel to the center axis. The reference signal multiplied by a specified factor is subtracted from a difference between signals from the adjacent sensing magnetometers (3). The magnetic field measurement system allows measurement of an extremely weak magnetic field by efficiently canceling the external field.

12 Claims, 15 Drawing Sheets

US 6,853,185 B2

MAGNETIC FIELD MEASUREMENT SYSTEM

CLAIM OF PRIORITY

The present application claims priority from Japanese application JP 2003-139754 filed on May 19, 2003, the content of which is hereby incorporated by reference into this application.

FIELD OF THE INVENTION

The present invention relates to a magnetic field measurement system for measuring a magnetic field generated from a measurement target, e.g., an extremely weak magnetic field generated from the heart, brain, or the like of a living body by using a magnetometer employing a high-sensitivity superconducting quantum interference device (SQUID) and, more particularly, to a magnetic field measurement system for canceling an external field.

BACKGROUND OF THE INVENTION

A magnetic field measurement system employing a SQUID has been used conventionally to measure a magnetic field (hereinafter referred to as a biomagnetic signal) generated from the brain, heart, or the like of a living body. In the measurement of an extremely weak magnetic field such as a biomagnetic signal, it is necessary to attenuate an external field encroaching in the magnetic field measurement system to the range of 80 dB –100 dB (decibel) or less. An external field is magnetic noise deriving from a power transmission line, a running train, an automobile, or the like and encroaching in the magnetic field measurement system through a commercial power source.

A conventional biomagnetic signal measurement system has been placed inside a magnetically shielded room using a ferromagnetic material such as a permalloy to perform measurement in an environment cut off from an external field. Since the magnetically shielded room using a ferromagnetic material such as a permalloy is high in cost and heavy in weight, medical facilities in which it can be placed are limited. Accordingly, there has been a demand for biomagnetic signal measurement using a simple magnetic shield lighter in weight and smaller in size which allows easy installation of the system even in a narrow place.

Although a magnetic shield having a simpler structure can implement a lower-cost system, it is required to remove an external field from a measured signal for the correction thereof since the simple magnetic shield cannot completely cut off the external field. Various methods have been tried for external field removal or correction, of which the method using a vector magnetometer to measure an external field is common.

A report has been made on a 1-ch magnetocardiograph which is a combination of a magnetometer for biomagnetic signal measurement and a tri-axial vector magnetometer capable of sensing the respective components of an external field in the x-, y-, and z-directions (see Non-Patent Document 1 (Prior Art 1)). In this report, the process of multiplying, by three different factors, signals for the x-, y-, and z-components of the external field sensed by the three magnetometers of the vector magnetometer and subtracting the result of multiplication from an output signal from the magnetometer for biomagnetic signal measurement was performed. In accordance with the method, it is necessary to simultaneously optimize the three factors.

Another report has been made on external field removal in a brain magnetic field measurement system having 165 sensing magnetometers (see Non-Patent Document 2 (Prior Art 2)). In the report, an attempt was made to reduce the influence of an external field by using four tri-axial vector gradiometers for external field measurement which are composed of 12 magnetometers for 153 sensing magnetometers. In accordance with the method also, it is necessary to simultaneously optimize a plurality of factors.

On the other hand, a biomagnetic signal measurement system which measures the normal line component of a biomagnetic signal and obtains the tangent line component thereof from the normal line component has been well known (see, e.g., Patent Document 1).

[Non-Patent Document 1] K. Sakuta et al., Physica C378–381 (2002), 1391–1395

[Non-Patent Document 2] V. Pizzella et al., Proceedings of Biomag, 2000, 939–942

[Patent Document 1]Japanese Laid-Open Patent Publication No. HEI 10-305019

SUMMARY OF THE INVENTION

Although Prior Art 1 has performed the process of multiplying, by the three different factors, the x-, y-, and z-components of the external field sensed by using the vector magnetometer and subtracting the result of multiplication from the output signal from the magnetometer for biomagnetic signal measurement, it has the problem that the three factors are difficult to determine and the scale of the system is increased disadvantageously because the three magnetometers for external field measurement are required for one sensing magnetometer. Prior Art 2 also has the problem that it is not easy to determine three or more factors that should be determined for correction.

The four tri-axial vector gradiometers for external field measurement also have the problem that the scale of the system is increased disadvantageously because the 12 magnetometers for external field measurement are required.

It is therefore an object of the present invention to provide a magnetic field measurement system which uses a simple cylindrical magnetic shield employing a smaller number of reference magneto-meters to allow efficient cancellation of an external field and measurement of an extremely weak magnetic field.

The magnetic field measurement system according to the present invention uses a magnetic shield having a shielding factor which is rather excellent in two directions other hand and orthogonal to an axial direction than in the axial direction, e.g., a cylindrical magnetic shield (cylindrical magnetic shield composed of a ferromagnetic material). Hereinafter, the center axis of the cylindrical magnetic shield is assumed to be an x-axis. A dewar is disposed inside the cylindrical magnetic shield. A plurality of sensing magnetometers are arranged inside the dewar in a direction such that a direction perpendicular to a plane of the respective pickup coils of the sensing magnetometers is orthogonal to the x-axis (see FIG. 1). The direction in which each of the sensing magnetometers senses a magnetic field corresponds to a component in the z-axis direction. These sensing magnetometers are arranged on the same plane perpendicular to the z-axis.

As a first reference magnetometer for sensing the component of an external field in the x-direction, a magnetometer is disposed in proximity to the sensing magnetometers such that the direction in which a magnetic field is sensed is oriented in the x-axis direction. Each of the plurality of sensing magnetometers and the first reference magnetometer is disposed inside the dewar and cooled with a cryogen. The dewar is held by a gantry.

Each of the magnetometers is controlled by an FLL (flux locked loop) circuit and an analog signal responsive to a magnetic field sensed by the magnetometer is outputted from the FLL circuit. The output from the FLL circuit is signal processed by an analog signal processing circuit including an amplifier, a bandpass filter, and a notch filter and then converted to a digital signal in an analog-to-digital converter. Signals measured by the individual sensing magnetometers are accumulated by an analyzing device (a computer), which executes analysis and displays the result of analysis. The signals measured by the individual magnetometers are stored in a device for recording the measurement signals.

Since the shielding factor of the cylindrical magnetic shield is rather excellent in the z- and y-directions, the z- and y-components of the external field have significantly been attenuated inside the cylindrical magnetic shield. On the other hand, the x- and y-components of the external field are orthogonal to the direction (z-direction) in which a SQUID magnetometer senses a magnetic field so that the majority of the x- and y-components of the external field is not sensed by the sensing magnetometers. Hence, the external field in the y-direction which is shielded by the magnetic shield and to which a SQUID magnetometer is less sensitive can practically be ignored. The majority of noise in the z-direction can be cancelled by calculating a difference between the output signals from the sensing magnetometers which are arranged adjacent to each other. The majority of the noise in the z-direction can also be cancelled by calculating a difference between the output signals from the sensing magnetometers which are disposed at different positions not adjacent to each other. The foregoing differences can be calculated after the accumulation of data by the computer.

An arithmetic operation of correcting the x-component of the external field and determining a first measurement signal under less influence of the external field is performed by subtracting, from the foregoing difference between the measurement signals, a value obtained by multiplying a signal from the first reference magnetometer by a first specified factor.

Alternatively, the magnetic field measurement system according to the present invention has a structure in which a second reference magnetometer is used in addition to the first reference magnetometer and disposed such that the center axis of the pickup coil of the second reference magnetometer coincides with the center axis of the pickup coil of the first reference magnetometer. In this case, after the first measurement signal is determined, an arithmetic operation for determining a second measurement signal under less influence of the external field is performed by subtracting, from the first measurement signal, a value obtained by multiplying a difference between the first and second reference signals by a second specified factor.

Alternatively, the magnetic field measurement system according to the present invention has a structure in which, in addition to the first reference magnetometer, third and fourth reference magneto-meters each for sensing the component of the external field in the z-direction are disposed on a plane parallel to a plane on which the sensing magnetometers are disposed such that the fourth reference magnetometer is positioned at a larger distance than the third reference magnetometer in a direction along the center axis of the cylindrical magnetic field. In this case, after the first measurement signal is determined, an arithmetic operation for determining a third measurement signal under less influence of the external field is performed by subtracting, from the first measurement signal, a value obtained by multiplying a difference between measurement signals sensed by the third and fourth reference magnetometers by a third specified factor.

Alternatively, the magnetic field measurement system according to the present invention has a structure having an additional magnetometer for measuring a dynamic range compression signal which sense the component of the external field in the z-direction, a measurement circuit for sensing the perpendicular component of the external field by driving the magnetometer for measuring a dynamic range compression signal and outputting the sensed component as a dynamic range compression signal, and a differential amplifier circuit for subtracting the dynamic range compression signal from each of the measurement signals from the plurality of sensing magnetometers and outputting the measurement signals from the sensing magnetometers each having a compressed dynamic range.

Alternatively, the magnetic field measurement system according to the present invention has a structure in which the plurality of sensing magnetometers are divided into a plurality of blocks and a reference magnetometer is disposed for each of the blocks.

The magnetic field measurement system according to the present invention which has been described heretofore assumes the calculation of the difference between the adjacent sensing magnetometers to cancel the z-component of the external field. Accordingly, a signal to be measured finally is not a magnetic field itself but a gradient magnetic field.

With the foregoing structures, it becomes possible to efficiently obtain a measurement signal under less influence of the external field by using a small number of reference magnetometers in a magnetic field measurement system using a cylindrical magnetic shield.

DESCRIPTION OF THE PREFERRED EMBODIMENTS

By way of example, a description will be given herein below to a magnetocardiographic measurement system which measures a magnetic field emitted from the heart of a living body as a measurement target. However, the present invention is not limited to this example. The present invention is also applicable to a magnetosensitive measurement system which senses, e.g., the presence or absence of a magnetic material contained in a normal measurement target, an amount of the magnetic material, the distribution of the magnetic material, or the like. The following disclosure is only an embodiment of the present invention and by no means limits the technical scope of the present invention.

In each of FIGS. 5A, 5B, 6A, 6B, 7, 12, and 14, the ordinate represents a magnetic field (nT) and the abscissa represents a relative time (s) when a given measurement time is assumed to be 0.

Embodiment 1

Figure 1A:
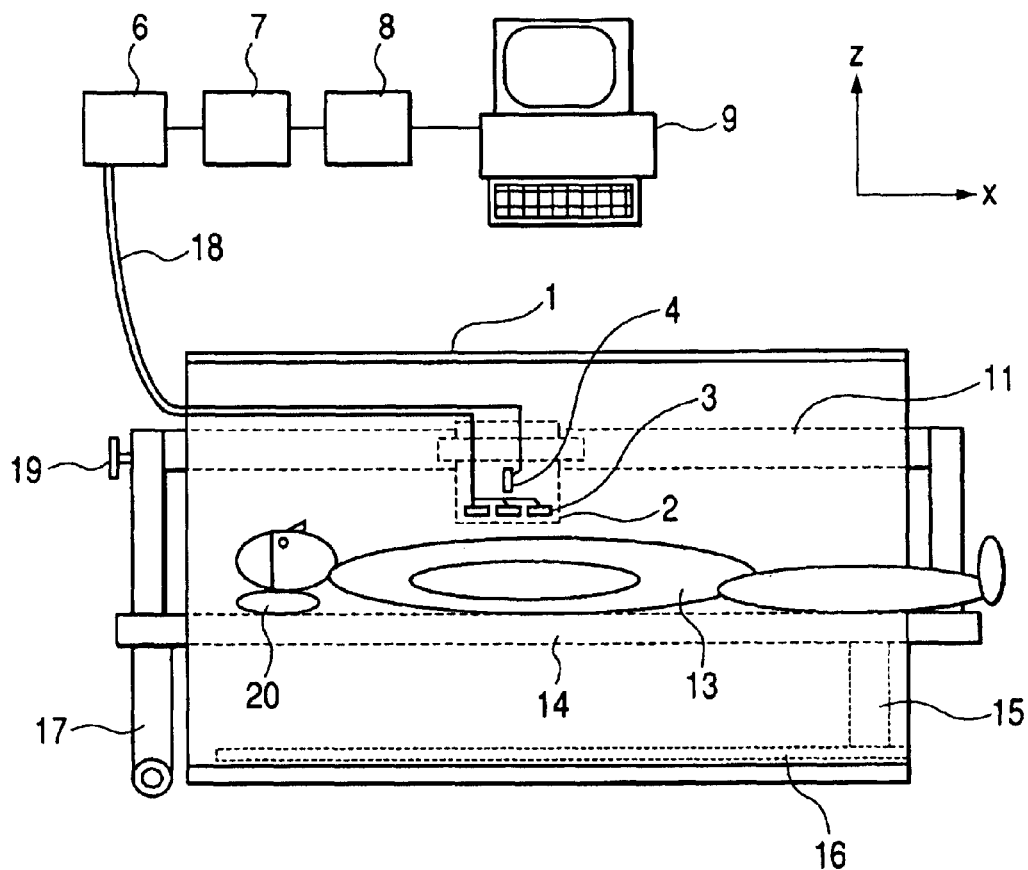
FIGS. 1A and 1B are views each showing an example of a structure of a magnetic field measurement system according to a first embodiment of the present invention.
Figure 1B:
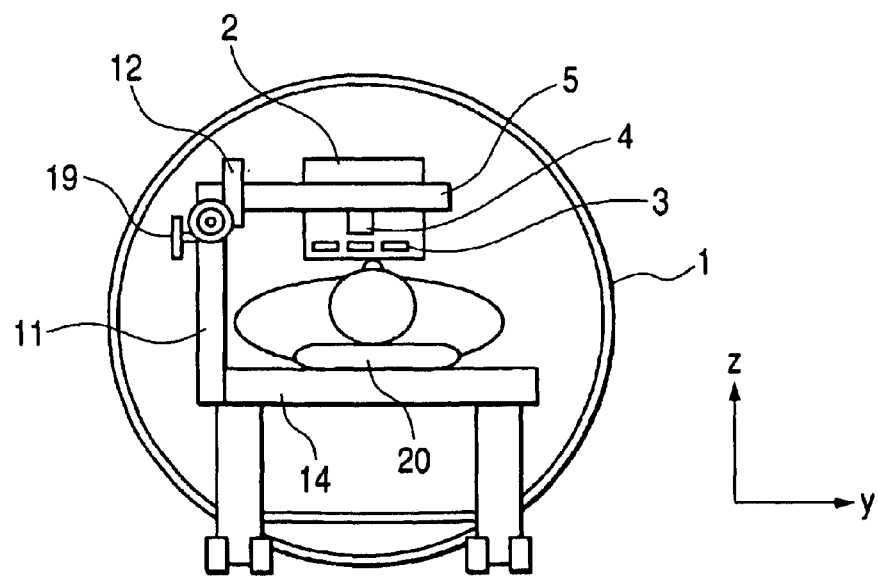

FIGS. 1 are views each showing an example of a structure of a magnetic field measurement system according to a first embodiment of the present invention, which is a magnetocardiographic measurement system using a cylindrical magnetic shield. It is assumed that the center axis of the cylindrical magnetic shield 1 is an x-axis and two axes orthogonal to the x-axis are y- and z-axes. Of FIGS. 1, FIG. 1A is an x-z cross sectional view and FIG. 1B is a y-z cross sectional view.

In the transversely mounted cylindrical magnetic shield 1, a bed 14 on which a subject 13 lies down in a recumbent position with his or her head supported by a pillow 20 and a dewar 2 are disposed. A plurality of sensing magnetometers 3 and a first reference magnetometer 4 are disposed on the inner bottom portion of the dewar 2 and cooled with a cryogen. The first embodiment has used the magnetometers each composed of a high critical temperature superconductor operable at a liquid nitrogen temperature and cooled the magnetometers by charging the dewar with liquid nitrogen. The dewar 2 is held by a gantry 5 having an alignment mechanism.

The position of the gantry 5 for fixing the dewar 2 is adjusted by using a gantry position adjustment mechanism 12 having a mechanism for movement in the directions of the three axes (x-, y-, and z-axes). A gantry position adjustment handle 19 has been connected mechanically to the gantry position adjustment mechanism 12 such that the position of the gantry 5 is adjusted by rotating the handle 19.

The bed 14 is supported by two legs 17 with tires closer to the head of the subject 13 and by two slidable bed legs 15 (which are constantly located in the magnetic shield 1). The bed 14 can be drawn out of or inserted into the magnetic shield 1 by moving the two legs 17 with tires over a floor and thereby sliding the two bed legs 15 over guide rails 16. Since the bed 14 can easily be drawn out of the magnetic shield 1, the subject 13 is allowed to easily come in and go out of the magnetic shield 1 and the position of the gantry 5 can easily be adjusted.

Each of the units disposed in the magnetic shield including the bed 14, the dewar 2, and the gantry 5 is composed of a non-magnetic material such as FRP (Fiber Reinforced Plastic) or aluminum.

A plurality of sensing magnetometers have respective pickup coils disposed on the same plane parallel to an xy plane perpendicular to the z-axis so that the plane of the pickup coils is perpendicular to the z-axis. The sensing magnetometers sense a magnetic field component in the z-axis direction. The first reference magnetometer 4 for sensing the component of an external field in the x-axis direction is disposed in proximity to the sensing magnetometers 3 such that the direction in which a magnetic field is sensed is oriented in the x-axis direction.

The operation of driving the plurality of sensing magnetometers 3 and the first reference magnetometer 4 is controlled by an FLL circuit 6 and an analog signal responsive to the magnitude of the magnetic field sensed by each of the magnetometers is outputted from the FLL circuit 6. The output of the FLL circuit 6 is signal processed in an analog signal processing circuit 7 including an amplifier, a bandpass filter, and a notch filter.

A signal line 18 is composed of a bundle of multiple cables for transmitting sensed signals from the magnetometers 3 and 4 to the FLL circuit 6 and a bundle of cables for allowing a bias current, a feedback current, and a heater current to flow from the FLL circuit 6 to the magnetometers 3 and 4. An output of the signal processing circuit 7 is converted to a digital signal in an analog-to-digital converter 8 and accumulated by a computer 9. The computer 9 performs various signal processing with respect to the accumulated signal.

The external field includes three components in the x-, y-, and z-directions. Since the shielding factor of the cylindrical magnetic shield is excellent in the z-axis and y-axis directions perpendicular to the x-axis shown in FIG. 1, the components of the external field in the z-axis and y-axis directions have been significantly attenuated inside the cylindrical magnetic shield. On the other hand, the components of the external field in the x- and y-directions are orthogonal to the direction in which a SQUID magnetometer senses a magnetic field so that the majority of them is not sensed by the magnetometer. Accordingly, the external field in the y-direction which is shielded by the magnetic shield and to which the SQIOD magnetometer is less sensitive can practically be ignored.

The majority of the component of the external field in the z-axis direction can be cancelled by calculating a difference between output signals from the adjacent sensing magnetometers 3. The difference can be calculated after data is accumulated by the computer.

The computer 9 performs an arithmetic operation of subtracting, from the difference between the output signals from the adjacent sensing magnetometers 3, a value obtained by multiplying a measurement signal from the first reference magnetometer 4 by a first specified factor to correct the component of the external field in the x-axis direction to determine a first measurement signal under less influence of the external field.

Figure 2A:
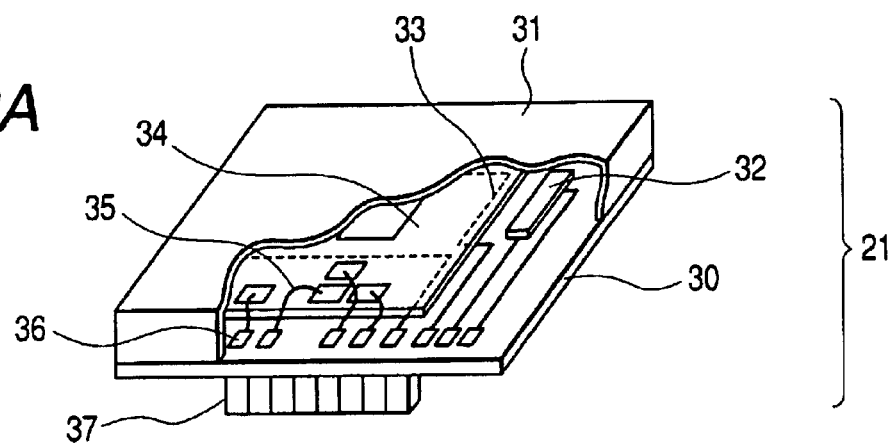
FIGS. 2A to 2C are views each showing a structure of each of magnetometers used in the first embodiment.
Figure 2B:
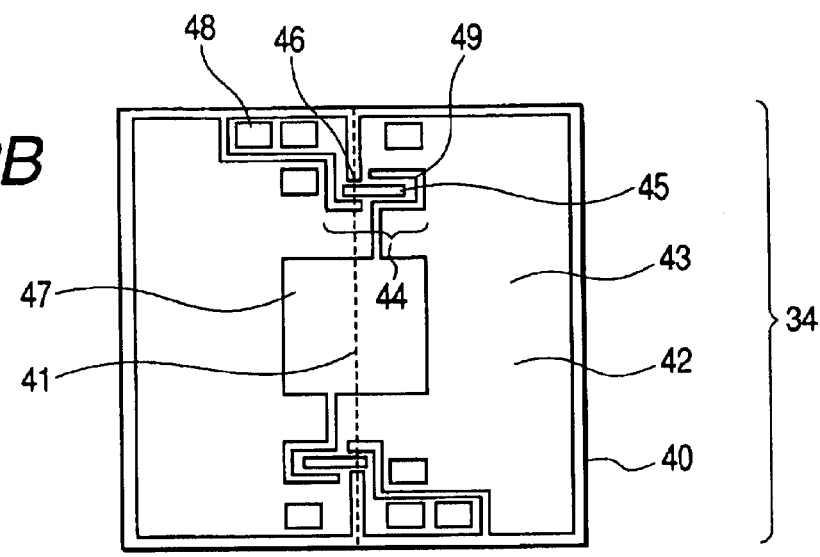
Figure 2C:
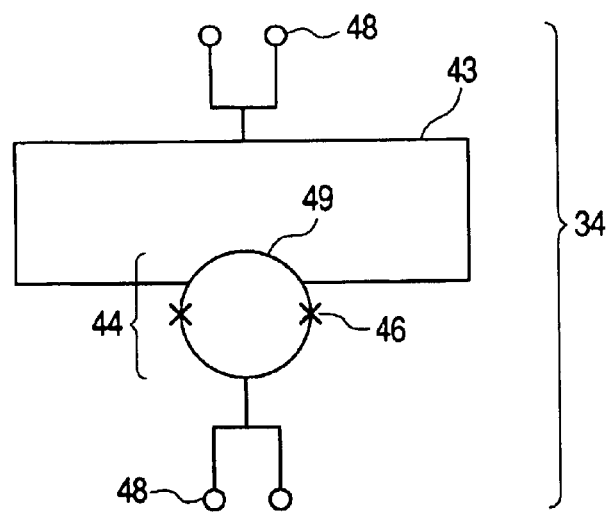

FIGS. 2 are views each showing a structure of each of the magnetometers used in the first embodiment of the present invention, of which FIG. 2A is a perspective view showing the structure of the magnetometer, FIG. 2B is a plan view showing a structure of a SQUID element, and FIG. 2C is an equivalent circuit diagram of the SQUID element.

A SQUID element 34 composed of a high critical temperature superconductor is fixed to a printed circuit board 30. The electrodes 48 of the SQUID element 34 are connected to the bonding pads 36 of the printed circuit board 30 with bonding wires 35 and to connectors 37 attached to the back surface of the printed circuit board. A feedback coil 33 is disposed on the printed circuit board 30. A heater 32 for removing a trapped flux is disposed on the printed circuit board 30. For the prevention of degradation, the SQUID element 34 is sealed together with the heater 32 in dry nitrogen by a cap 31.

The SQUID element 34 is a directly coupled magnetometer composed of a SQUID 44 (including a superconducting ring 49, two Josephson junctions 46, and a slit hole 45) and a pickup coil 43, which are formed in directly coupled relation on the same thin film. The SQUID element 34 used in the first embodiment is a directly coupled magnetometer composed of a $YB_2Cu_3O_y$ (YBCO) high critical temperature superconductor formed on a 15 mm×15 mm $SrTiO_3$ (100) bicrystal substrate 40 (at a tilt angle of 36.8*). The magnetometer in use had a typical white noise of 50 to 100 $fT/Hz^{1/2}$ expressed in terms of a magnetic field at 77 K.

The bicrystal substrate 40 is a substrate having a structure in which single crystals in two different orientations are bonded. A grainboundary 41 has been formed on the interface between two crystals. By epitaxially growing a superconducting thin film 42 composed of a high critical temperature superconductor on the bicrystal substrate 40, a grainboundary is formed also on the superconducting thin film along the grainboundary 41. Since the grainboundary 41 of the high critical temperature superconductor shows the characteristic of Josephson junction, the SQUID 44 having the two Josephson junctions 46 in the superconducting ring 49 can be produced by producing the superconducting ring 49 on the grainboundary 41. By producing the superconducting ring 49 through variable adjustment of the length of the slit hole 45 inside the super conducting ring 49, the inductance of the superconducting ring 49 as an important design parameter which determines the characteristics of the SQUID 44 is set to an optimum value.

The pickup coil 43 is a closed loop formed from a superconducting material. The hole 47 in the pickup coil defines the closed loop. A shielding current proportional to a magnetic flux across the pickup coil flows in the pickup coil. In the directly coupled magnetometer, a shielding current flows directly in the superconducting ring 49 of the SQUID 44 and a magnetic field is sensed.

Figure 3A:
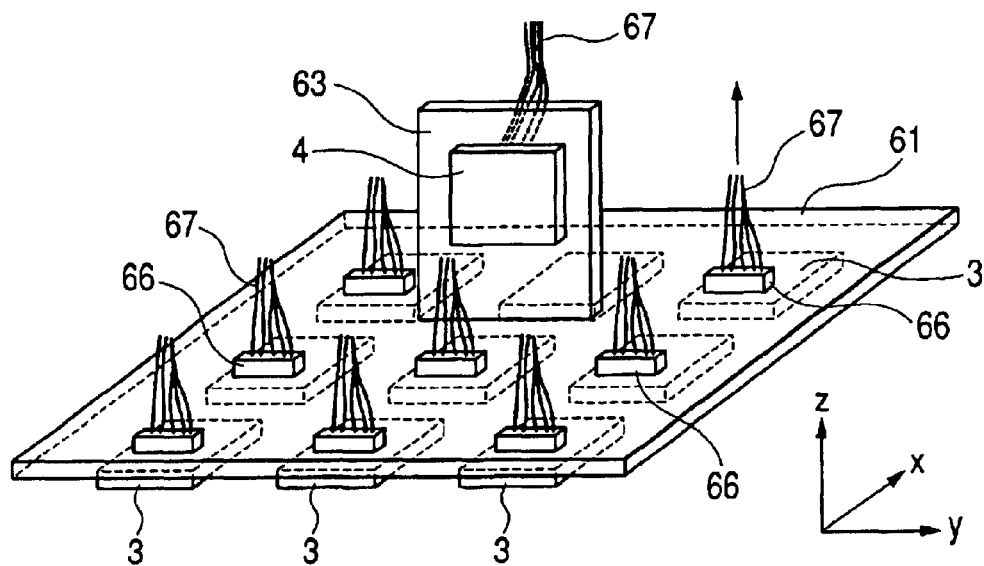
FIGS. 3A and 3B are views showing the arrangements of magnetometers in the embodiments of the present invention.

FIG. 3A is a view showing the arrangement of the magnetometers in the first embodiment.

In the first embodiment, nine magnetometers each of which is identical to the magnetometer 21 shown in FIG. 2A were used as the sensing magnetometers 3. The sensing magnetometers 3 in a 3×3 arrangement have been mounted on the lower surface of a plate 61 made of FRP and disposed in parallel to the center axis (x-axis) of the cylindrical magnetic shield 1 to define a first plane. The spacing between the respective centers of the adjacent magnetometers is 30 mm. The first reference magnetometer 4 for sensing the component of the external field in the x-axis direction has been disposed on a plate 63 defining a second plane perpendicular to the plate 61. The first reference magnetometer 4 has the same structure as the magnetometer 21 shown in FIG. 2A.

The respective connectors 37 of the individual magnetometers have been coupled to connectors arranged on the plate 61 and signal lines 67 have been connected to the connectors 66. These magnetometers have been placed inside the dewar 2 shown in FIG. 1 and cooled with liquid nitrogen. The signal lines 67 are withdrawn from the upper portion of the dewar 2, routed along a column 11 for fixing the gantry in parallel relation to the inner wall of the magnetic field to be drawn out of the shield, and connected to the FLL circuit 6.

Figure 4A:
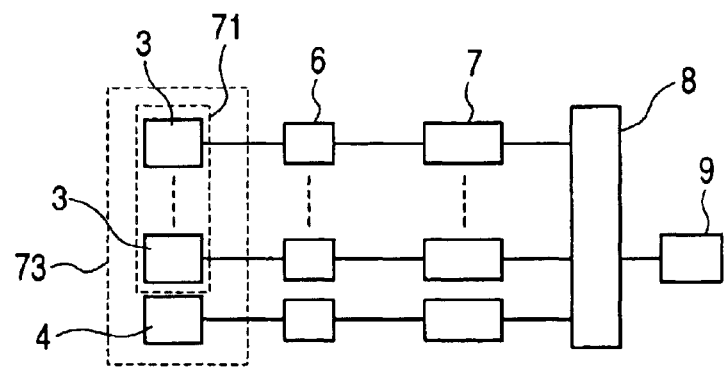
FIGS. 4A to 4C are views showing structures of measurement circuits in the embodiments of the present invention.

FIG. 4A is a view showing a structure of a measurement circuit in the embodiment of the present invention.

A plurality of sensing magnetometers 71 enclosed in the dotted rectangle indicate the group of sensing magnetometers 3 mounted on the plate 61. The portion enclosed in the dotted rectangle representing a cooling part 73 is disposed inside the dewar 2. An output signal from the FLL circuit 6 is processed in the analog signal processing circuit 7 to a properly amplified signal in the range of 0.1 Hz to 80 Hz, converted to a digital signal by the 16-bit analog-to-digital converter 8 in the subsequent stage, and recorded in the computer 9. A signal from the first reference magnetometer 4 also undergoes a similar process and is recorded in the computer 9.

A description will be given herein below to an actual measuring procedure. The subject 13 takes off a watch, a belt, or the like which generates a magnetic field and lies on his or her back on the bed 14 in a state extracted from the magnetic shield 1. Te bottom portion of the dewar 2 is aligned with the chest portion of the subject by adjusting the position of the gantry 5. The bed 14 is then pushed in the magnetic shield 1. In this state, a current of several tens of milliamperes is allowed to flow in the heater 32 fixed to the printed circuit board 30 of each of the magnetometers for 30 seconds to 60 seconds, thereby removing a trapped flux. The current in the heater is turned off and, after a waiting time of about 1 minute, a magnetocardiographic signal generated from the heart of the subject is measured for 2 minutes by measuring signals sensed by the nine sensing magnetometers and the one reference magnetometer.

A description will be given herein below to a method for canceling an external field for the measured signals. Although the first embodiment has arranged the sensing magnetometers as a 3×3 two-dimensional array as shown in FIG. 3A, the description will be given to the case where N×M sensing magnetometers are used as a common practice. It is assumed that the sensing magnetometer in the n-th row and the m-th column is represented by SQUID(m, n) and a measurement signal sensed by the SQUID(m, n) and outputted therefrom is represented by B(m, n). On the other hand, a first reference magnetometer is represented by Ref(1) and a first reference signal sensed by the Ref(1) is represented by B(ref, 1). A magnetic field vector from the living body and an external field vector at the position of the sensing magnetometer SQUID(m, n) are represented by S(m, n) and E(m, n), which are defined by Numerical Expressions 1 and 2.

$S(m,n)=(Sx(m,n),Sy(m,n),Sz(m,n))$  Numerical Expression 1

$E(m,n)=(Ex(m,n),Ey(m,n),Ez(m,n))$  Numerical Expression 2

The individual terms on the right side of each of Numerical Expressions 1 and 2 denote the respective components in the x-axis, y-axis, and z-axis directions. Since the center axis of the cylindrical magnetic shield is assumedly denoted by x, the shielding factor in each of the z- and y-directions perpendicular to the cylindrical axis is higher than in the x-direction in the cylindrical magnetic shield. This allows Numerical Expressions 3 and 4 to be assumed.

$$Ex(m,n) \gg Ez(m,n) \qquad \text{Numerical Expression 3}$$

$$Ex(m,n) \gg Ey(m,n) \qquad \text{Numerical Expression 4}$$

If a unit vector in the normal direction to the plane of the pickup coil of the SQUID(m, n) is assumed to be H(m, n)=(Hx(m, n), Hy(m, n), and Hz(m, n)), a measurement signal B(m, n) measured by the SQUID(m, n) and outputted therefrom is represented by Numerical Expression 5. Not external noise but a combination of noise inherent in the SQUID magnetometer and the noise of the FLL circuit is defined as the intrinsic noise N(m, n) of the magnetometer SQUID(m, n). If an amplifier is included in the FLL circuit or the analog signal processing circuit, the measurement signal is amplified and then outputted but it is assumed herein that the gain of the amplifier is 1 for easier handling. It is also assumed that Numerical Expression 6 is satisfied.

$$B(m,n)=H(m,n)\cdot(S(m,n)+E(m,n))+N(m,n)$$
$$=Hx(m,n)\cdot Sx(m,n)+Hy(m,n)\cdot Sy(m,n)+Hz(m,n)\cdot Sz(m,n)+$$
$$Hx(m,n)\cdot Ex(m,n)+Hy(m,n)\cdot Ey(m,n)+Hz(m,n)\cdot Ez(m,n)+N(m,n) \qquad \text{Numerical Expression 5}$$

$$Hx(m,n)^2+Hy(m,n)^2+Hz(m,n)^2=1 \qquad \text{Numerical Expression 6}$$

Since each of the sensing magnetometers has been disposed such that the direction in which a magnetic field is sensed is oriented in the z-axis direction, H(m, n)=(0, 0, 1) is satisfied in an ideal case so that an external field in a direction other than the z-direction is not sensed. However, it is difficult to arrange all the SQUID magnetometers such that they are completely parallel to the xy plane due to a mounting error or the like when the SQUID magnetometers are fixed. It is appropriate to consider that each of the SQUID magnetometers has actually been disposed at a certain small angle relative to the xy plane. In this case, Numerical Expressions 7, 8, and 9 can be assumed.

$$Hz(m,n)\sim 1 \qquad \text{Numerical Expression 7}$$

$$Hx(m,n) \ll 1 \qquad \text{Numerical Expression 8}$$

$$Hy(m,n) \ll 1 \qquad \text{Numerical Expression 9}$$

For the analysis of a magnetocardiographic signal obtained from measurement using a multi-channel magnetocardiograph, an analysis method in which a two-dimensional image is displayed as a current distribution equivalent to the measured magnetic field (a current arrow map method) was used. In accordance with the current arrow map method, a two-dimensional current vector i obtained by projecting a current vector equivalent to a magnetic field at a given point on the xy plane can be approximated with Numerical Expression 10.

$$i \propto (\Delta Bz/\Delta x, -\Delta Bz/\Delta y) \qquad \text{Numerical Expression 10}$$

where Bz is the component of a magnetic field in the z-axis direction. Quantities which are necessary to determine the current vector are the gradient of a z-direction magnetic field to an x-direction ($\Delta Bz/\Delta x$) and the gradient of the z-direction magnetic field to a y-direction ($\Delta Bz/\Delta y$), which are Sz(m, n)−Sz(m+1, n) and Sz(m, n)−Sz(m, n+1), respectively. The magnetic field gradient Sz(m, n)−Sz(m+1, n) can be determined by using the difference B(m, n)−B(m+1, n) between the adjacent sensing magnetometers. The difference B(m, n)−B(m+1, n) between the sensing magnetometers which are adjacent in the x-direction is defined as x(m, n) and the difference B(m, n)−B(m, n+1) between the sensing magnetometers which are adjacent in the y-direction is defined as y(m, n). Hence, the difference between the sensing magneto-meters which are adjacent in the x-direction is given by Numerical Expression 11.

$$x(m,n)=B(m,n)-B(m+1,n)=$$
$$\{Hx(m,n)\cdot Sx(m,n)-Hx(m+1,n)\cdot Sx(m+1,n)\}+$$
$$\{Hy(m,n)\cdot Sy(m,n)-Hy(m+1,n)\cdot Sy(m+1,n)\}+$$
$$\{Hz(m,n)\cdot Sz(m,n)-Hz(m+1,n)\cdot Sz(m+1,n)\}+$$
$$\{Hx(m,n)\cdot Ex(m,n)-Hx(m+1,n)\cdot Ex(m+1,n)\}+$$
$$\{Hy(m,n)\cdot Ey(m,n)-Hy(m+1,n)\cdot Ey(m+1,n)\}+$$
$$\{Hz(m,n)\cdot Ez(m,n)-Hz(m+1,n)\cdot Ez(m+1,n)\}+$$
$$\{N(m,n)-N(m+1,n)\} \qquad \text{Numerical Expression 11}$$

By way of example, a description will be given herein below to the difference between the sensing magnetometers which are adjacent in the x-direction. However, the present invention is also applicable to the difference between the sensing magnetometers which are adjacent in the y-direction based on the same concept. Since the unit vector H(m, n) normal to the plane of the pickup coil of the SQUID(m, n) is substantially perpendicular to the xy plane, the respective z-components of the unity vectors H(m, n) and H(m+1, n) can be approximated with Numerical Expressions 12 and 13, respectively.

$$Hz(m,n) \sim 1 \qquad \text{Numerical Expression 12}$$

$$Hz(m+1,n) \sim 1 \qquad \text{Numerical Expression 13}$$

Accordingly, the third term on the right side of Numerical Expression 11 becomes the magnetic field gradient Sz(m, n)−Sz(m+1, n). It can be considered that the influence of the components of the magnetocardiographic signal in the x-axis and y-axis directions represented by the first and second terms on the right side of Numerical Expression 11 on the magnetic field gradient Sz(m, n)−Sz(m+1, n) to be determined can practically be ignored. This is because the respective components of the unit vectors H(m, n) and H(m+1, n) in the y-axis and z-axis directions are nearly zero.

The intrinsic noise of each of the magneto-meters differs from one magnetometer to another because it is dependent on the junction characteristic of Josephson junction, the noise level of a preamplifier circuit used for the FLL circuit, and the like. However, since a system is constructed normally by using magneto-meters which are equal to an extent in intrinsic noise, the intrinsic noises of the individual magnetometers can be represented by the average value $N_{ave}$ thereof. Since the respective intrinsic noises of the individual magnetometers have no correlation therebetween, the seventh term on the right side of Numerical Expression 11 becomes $\sqrt{2} \cdot N_{ave}$. Based on the foregoing assumption, the difference x(m, n) between the sensing magnetometers which are adjacent in the x-direction is represented by Numerical Expression 14.

$$x(m,n)=\{Sz(m,n)-Sz(m+1,n)\}+\sqrt{2}\cdot N_{ave}+$$
$$\{Hx(m,n)\cdot Ex(m,n)-Hx(m+1,n)\cdot Ex(m+1,n)\}+$$
$$\{Hy(m,n)\cdot Ey(m,n)-Hy(m+1,n)\cdot Ey(m+1,n)\}+$$
$$\{Hz(m,n)\cdot Ez(m,n)-Hz(m+1,n)\cdot Ez(m+1,n)\} \quad \text{Numerical Expression 14}$$

Consideration will be given next to the external field. It can be expected that external fields at the positions of the adjacent magnetometers have considerably strong correlation therebetween. Therefore, it is assumed that the external fields have strong correlation therebetween and each of the external fields can be reduced to a practically sufficient level if the external fields at the positions of the adjacent magnetometers are measured precisely and the difference therebetween is calculated. That is, Numerical Expressions 15, 16, and 17 are assumed.

$$Ex(m,n)=Ex(m+1,n) \quad \text{Numerical Expression 15}$$
$$Ey(m,n)=Ey(m+1,n) \quad \text{Numerical Expression 16}$$
$$Ez(m,n)=Ez(m+1,n) \quad \text{Numerical Expression 17}$$

In the first embodiment, the spacing between the respective centers of the adjacent magnetometers is 30 mm, while the inner diameter of the cylindrical magnetic shield is 800 mm, so that the foregoing assumption is sufficiently proper. Based on the assumption, the difference x(m, n) between the sensing magnetometers which are adjacent in the x-direction is given by Numerical Expression 18.

$$x(m,n)=\{Sz(m,n)-Sz(m+1,n)\}+\sqrt{2}\cdot N_{ave}+$$
$$\{Hx(m,n)-Hx(m+1,n))\cdot Ex(m,n)\}+$$
$$\{Hy(m,n)-Hy(m+1,n))\cdot Ey(m,n)\}+$$
$$\{Hz(m,n)-Hz(m+1,n)\}\cdot Ez(m,n)\} \quad \text{Numerical Expression 18}$$

Since the component of the external field in the z-axis direction which is represented by the fifth term on the right side of Numerical Expression 18 is considered to be sufficiently small in terms of the correlation between Numerical Expressions 12 and 13, it can be ignored. In addition, the component of the external field in the y-axis direction which is represented by the fourth term in Numerical Expression 18 is considered to be sufficiently smaller than the component of the external field in the x-axis direction which is represented by the third term of Numerical Expression 18 in terms of the correlation between Numerical Expressions 4 and 9. Hence, the main component of the external field contained in Numerical Expression 18 is the component of the external field in the x-axis direction which is represented by the third term therein. By correcting the component of the external field in the x-axis direction, therefore, the external field can efficiently be reduced to a practical level.

In the present invention, the first reference magnetometer is used to correct the component of the external field in the x-axis direction which is represented by the third term in Numerical Expression 18. An external field vector (E(Ref, 1)) at the position of the reference magnetometer SQUID (Ref, 1) is assumedly given by Numerical Expression 19.

$$E(Ref,1)=(Ex(Ref,1),Ey(Ref,1),Ez(Ref,1)) \quad \text{Numerical Expression 19}$$

Since the reference magnetometer is positioned at a distance from the living body, it is assumed that a magnetic field from the living body is ignorable. In the cylindrical magnetic shield, the shielding factor is higher in each of the y- and z-directions perpendicular to the cylindrical axis (x-axis) than in the x-direction so that Numerical Expressions 20 and 21 are established.

$$Ex(Ref,1)>>Ey(Ref,1) \quad \text{Numerical Expression 20}$$
$$Ex(Ref,1)>>Ez(Ref,1) \quad \text{Numerical Expression 21}$$

It is assumed that a unit vector H(Ref, 1) normal to the reference magnetometer is given by Numerical Expression 22.

$$H(Ref,1)=(Hx(Ref,1), Hy(Ref,1), Hz(Ref,1)) \quad \text{Numerical Expression 22}$$

It is also assumed that Numerical Expression 23 is satisfied.

$$Hx(Ref,1)^2+Hy(Ref,1)^2+Hz(Ref,1)_2=1 \quad \text{Numerical Expression 23}$$

Since the unit vector H(Ref, 1) normal to the reference magnetometer is substantially parallel to the x-axis, Numerical Expressions 24, 25, and 26 can be assumed.

$$Hy(Ref,1)<<1 \quad \text{Numerical Expression 24}$$
$$Hz(Ref,1)<<1 \quad \text{Numerical Expression 25}$$
$$Hx(Ref,1)\sim 1 \quad \text{Numerical Expression 26}$$

If it is assumed that a reference signal sensed by the reference magnetometer is B(Ref, 1) and the intrinsic noise is Nave, Numerical Expression 27 is established.

$$=Hx(Ref,1)\cdot Ex(Ref,1)+Hy(Ref,1)\cdot Ey(Ref,1)$$
$$+Hz(Ref,1)\cdot Ez(Ref,1)+N_{ave} \quad \text{Numerical Expression 27}$$

If consideration is given to the correlation among Numerical Expressions 20, 21, 24, and 25, Numerical Expression 27 can be approximated with Numerical Expression 28.

$$B(Ref,1)=Hx(Ref,1)\cdot Ex(Ref,1)+N_{ave} \quad \text{Numerical expression 28}$$

By assuming that Ex(m, n) and Ex(Ref, 1) have excellent correlation therebetween and performing a correction by multiplying the signal B(Ref, 1) from the reference magnetometer by a first correction factor Ax(m, n), the component of the external field in the z-direction contained in the difference signal x(m, n) between the sensing magnetometers which are adjacent in the x-direction can be corrected. If a corrected first measurement signal is assumed to be Cx(m, n), the Cx(m, n) is given by Numerical Expression 29 so that a measurement signal under less influence of the external field, which is given by Numerical Expression 31, is obtainable by selectively determining the first correction factor Ax(m, n) which satisfies Numerical Expression 30.

$$Cx(m,n)=x(m,n)-Ax(m,n)\cdot B(Ref,1)$$
$$=\{Sz(m,n)-Sz(m+1,n)\}+\sqrt{2}\cdot N_{ave}+\{Hx(m,n)-Hx(m+1,n)\}\cdot$$
$$Ex(m,n)-Ax(m,n)\cdot B(Ref,1)$$
$$=(Sz(m,n)-Sz\ (m+1,n)\}+\sqrt{\{2+(Ax(m,n))^2\}}\cdot N_{ave}$$
$$+\{(Hx(m,n)-Hx(m+1,n)\}-Ax(m,n)\cdot Bx$$
$$(Ref,1))\cdot Ex(m,n) \quad \text{Numerical Expression 29}$$

$$Ax(m,n)=\{Hx(m,n)-Hx(m+1,n)\}/Hx(Ref,1) \quad \text{Numerical Expression 30}$$

$$Cx(m,n)=Sz(m,n)-Sz(m+1,n)+\sqrt{\{2+(Ax(m,n))^2\}}\cdot N_{ave} \quad \text{Numerical Expression 31}$$

Since Ax(m, n) represented by Numerical Expression 30 has a value sufficiently smaller than 1 in terms of Numerical Expressions 8 and 26, the intrinsic noise of the reference magnetometer causes only a slight increase in the noise of the corrected first measurement signal. In an actual situation, it was difficult to precisely measure the Hx(m, n), Hx(m+1, n), and Hx(Ref, 1) contained in Numerical Expression 30 so that a value predetermined in accordance with the following method was used as the first correction factor Ax(m, n). The B(m, n), B(m+1, n), and B(Ref, 1) in a given time range (which was assumed to be typically 60 seconds) were measured and the time average values Bave(m, n), Bave(m+1, n), and Bave(Ref, 1) thereof were calculated. Then, the Ax(m, n) was determined such that the sum of squares of the value calculated by using Numerical Expression 32 becomes minimum in the given time range.

$$\{(B(m,n)-Bave(m,n))-(B(m+1,n)-Bave(m+1,n))\}-Ax(m,n)\cdot\{B(Ref, 1)-Bave(Ref,1)\}$$ Numerical Expression 32

It is to be noted that this method is only exemplary and the value of the Ax(m, n) may also be determined by using another algorithm. Although the first embodiment has performed analysis by using the predetermined first correction factor, it is also possible to determine the first correction factor for an actual measurement signal every time measurement is performed.

Although the foregoing description has been given to the difference in the x-direction by way of example, a difference y(m, n) in the y-direction is represented by Numerical Expression 33. A measurement signal (represented by Numerical Expression 35) under less influence of the external field can also be obtained for the difference in the y-direction by correcting the external field in the x-direction by using Numerical Expression 34 on the assumption that the first correction factor is Ay(m, n).

$$y(m,n)=\{Sz(m,n)-Sz(m,n+1)\}+\sqrt{2}\cdot N_{ave}$$
$$+\{Hx(m,n)-Hx(m,n+1)\}\cdot Ex(m,n)$$
$$+\{Hy(m,n)-Hy(m,n+1)\}\cdot Ey(m,n)$$
$$+\{Hz(m,n)-Hz(m,n+1)\}\cdot Ez(m,n)$$ Numerical Expression 33

$$Ay(m,n)=\{Hx(m,n)-Hx(m,n+1)\}/Hx(Ref,1)$$ Numerical Expression 34

$$Cy(m,n)=y(m,n)-Ay(m,n)\cdot B(Ref,1)$$
$$=Sz(m,n)-Sz(m,n+1)+\sqrt{2}\cdot N_{ave}$$ Numerical Expression 35

Figure 5A:
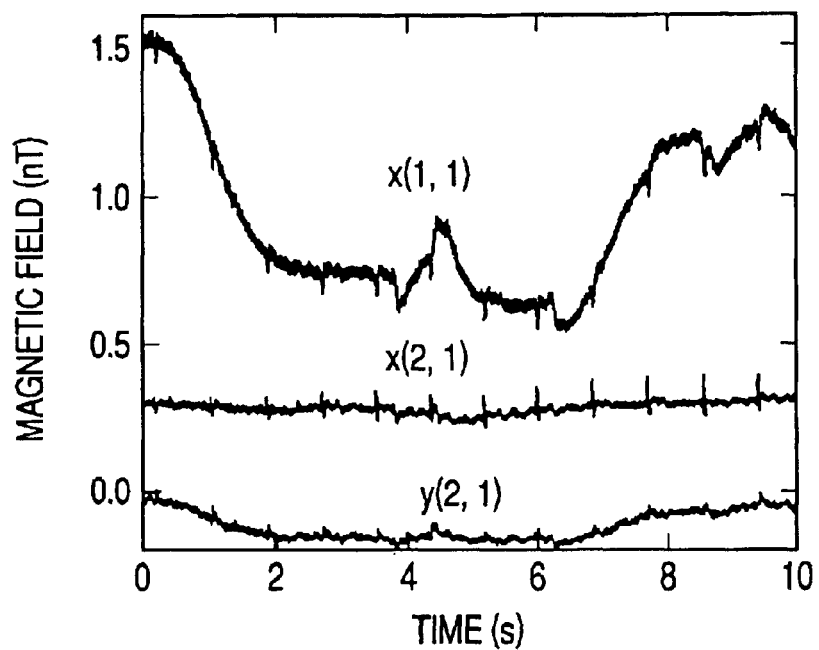
FIGS. 5A and 5B are views showing examples of magneto-cardiograms (MCGs) obtained from measurement using the magnetic field measurement system according to the first embodiment.
Figure 5B:
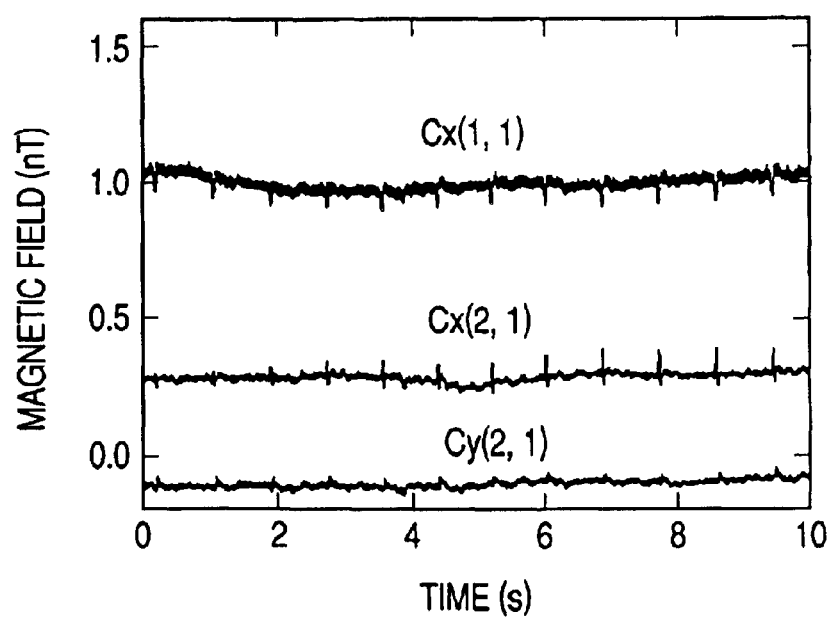

FIGS. 5 are views each showing examples of magneto-cardiograms obtained from measurement using the magnetic field measurement system according to the first embodiment, of which FIG. 5A shows magnetic field signals when the external field correction according to the first embodiment has not been performed and FIG. 5B shows magnetic field signals when the external field correction according to the first embodiment has been performed.

The bandwidth was in the range of 0.1 Hz to 80 Hz and analog notch filters of 50, 100, and 150 Hz were also used. The sampling frequency was 1 kHz. FIG. 5A shows the time-varying waveforms of the X(1,1), X(2, 1), and Y(2, 1) which are the differences between signals from the adjacent magnetometers in a descending order. Although an objective magneto-cardiogram is also observed in the differential signals, it has largely fluctuated under the influence of the external field. FIG. 5B shows the results Cx(1,1), Cx(2, 1), and Cy(2, 1) of the external field correction using the method according to the first embodiment. The large fluctuations have been removed substantially completely therefrom so that the effect of the first embodiment is recognizable.

Although the effect of the present embodiment has been proved in the 3×3 arrangement, the same effect can be expected even in a 4×4 or larger-scale arrangement of magneto-meters.

Embodiment 2

The magnitude of an external field greatly depends on the location at which the system is placed. The external field largely fluctuates at a location closer to, e.g., a railroad track or an elevator.

Figure 6A:
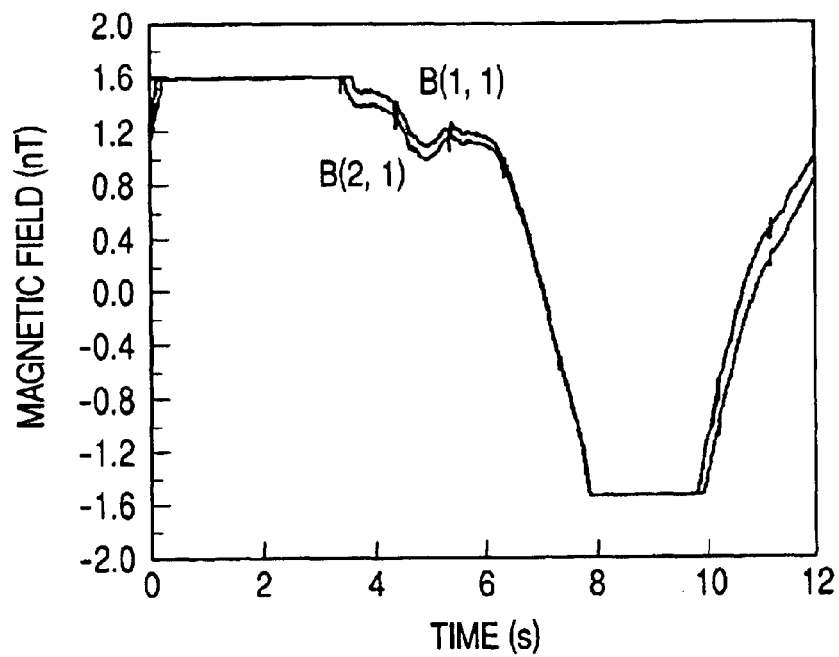
FIGS. 6A and 6B are views each showing examples of magnetocardiograms obtained from measurement using a magnetic field measurement system according to a second embodiment of the present invention.
Figure 6B:
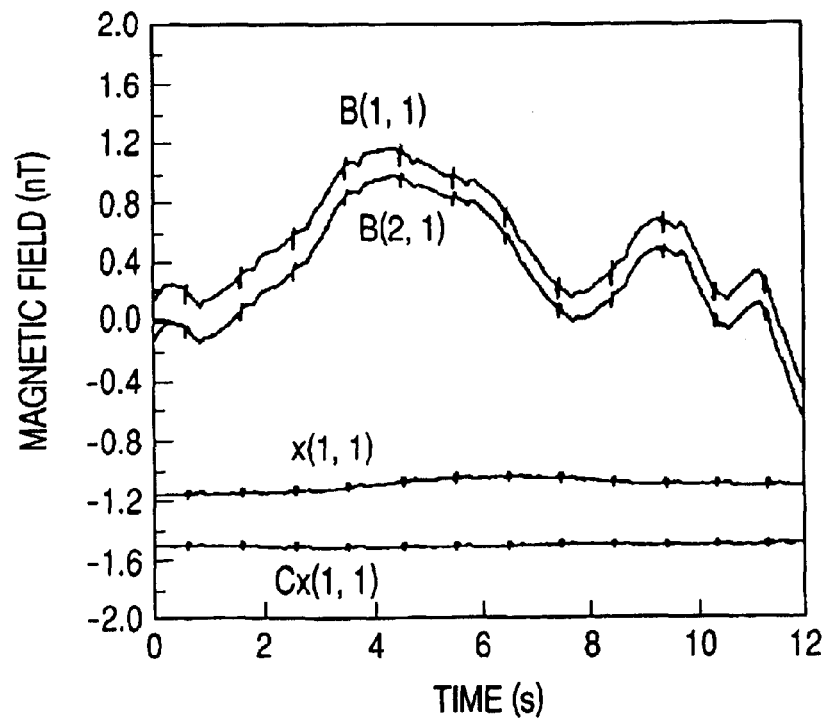

FIGS. 6 are views showing examples of magneto-cardiograms obtained from measurement using a magnetic field measurement system according to a second embodiment of the present invention, of which FIG. 6A shows magnetic field signals when external field correction according to the second embodiment has not been performed and FIG. 6B shows magnetic field signals when the external field correction according to the second embodiment has been performed.

FIG. 6A shows the waveforms of output signals (B(1, 1), B(2, 1)) from the sensing magnetometers when measurement was performed by placing a magnetocardiograph (magnetic field measurement system) inside a building positioned at a distance of about 30 m from a train track. The band was in the range of 0.1 Hz to 80 Hz and analog notch filters of 50, 100, and 150 Hz were also used. Since a large fluctuation occurred in the external field when a train passed, a measurement signal was saturated as a result of exceeding the input dynamic range of the analog-to-digital converter in the subsequent stage. Although the problem can be solved by using a 24-bit analog-to-digital converter with a wider input dynamic range instead of the 16-bit analog-to-digital converter, the solution is not preferred because of high cost. The second embodiment solves the problem by using a signal for compressing a dynamic range to compress the measurement signal before it is inputted to the analog-to-digital converter.

Figure 3B:
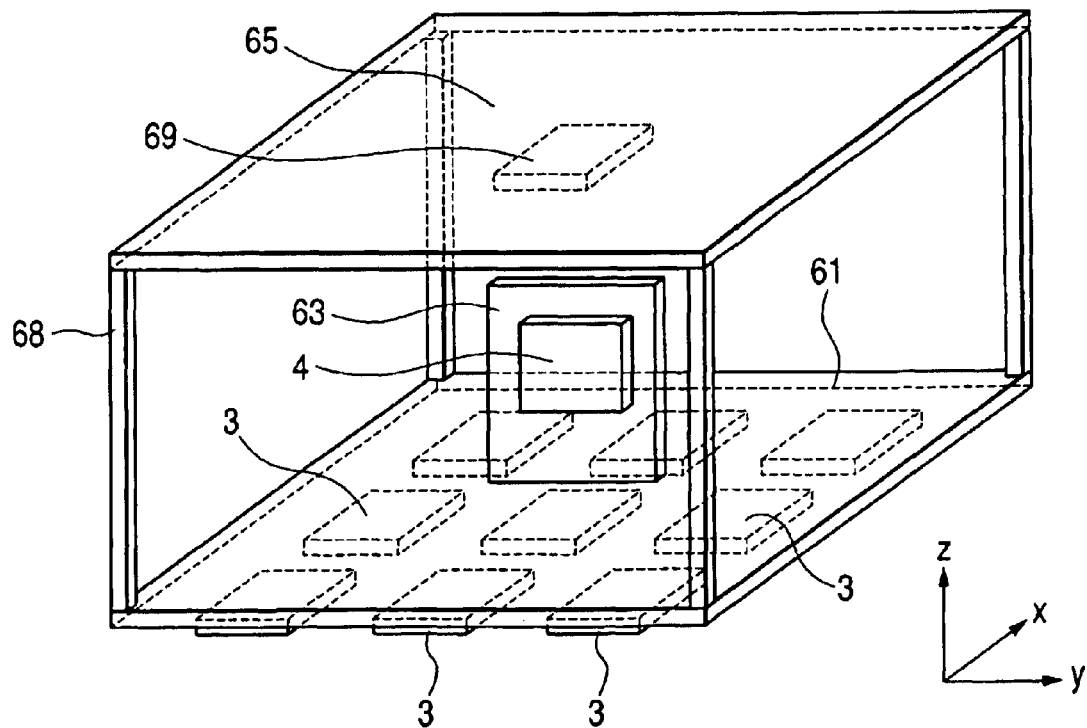

FIG. 3B is a view showing the arrangement of the magnetometers according to the second embodiment. FIG. 3B shows the arrangement of the magnetometers placed inside the dewar 2. The structure shown in FIG. 3B has been obtained by adding a compression signal magnetometer 69 to the structure according to the first embodiment described with reference to FIG. 3A. The compression signal magnetometer 69 has been fixed to a plate 65 defining a third plane parallel to the plate 61 such that the direction in which the compression signal magnetometer 69 senses a magnetic field becomes perpendicular to the plate 65. The plates 61 and 65 are fixed in parallel relation by four columns 68 made of a nonmagnetic material. In the second embodiment, the distance between the plates 61 and 65 has been adjusted to 60 mm.

Figure 4B:
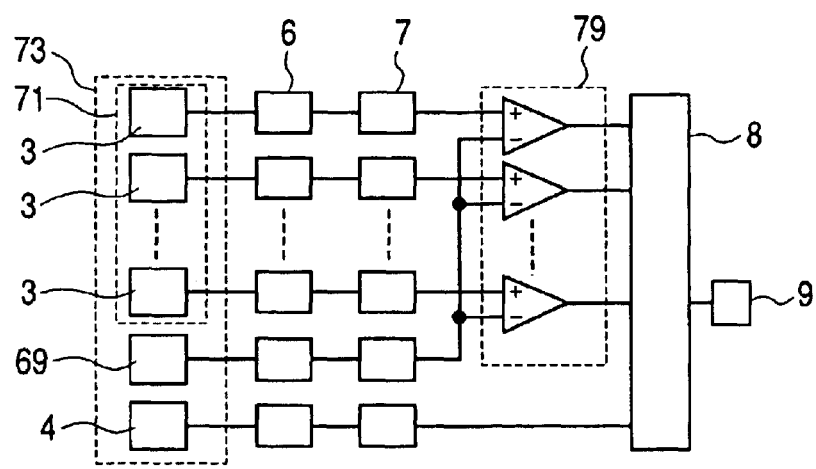
Figure 4C:
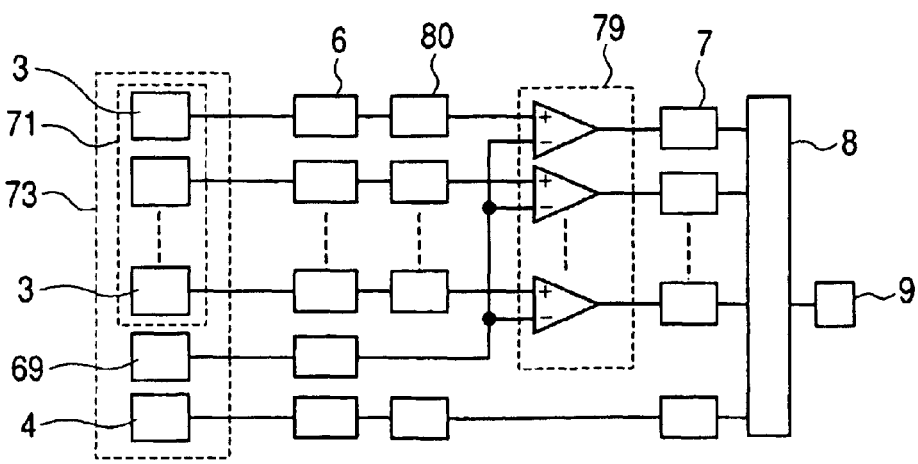

FIG. 4B is a view showing a structure of a measurement circuit according to the second embodiment. FIG. 4C is a view showing a structure of another measurement circuit according to the second embodiment.

As shown in FIG. 4B, the magnetocardiograph is constructed to pass measurement signals through a differential amplifier 79 such that a compression signal measured by the compression signal magnetometer 69 is subtracted from each of the measurement signals before they are inputted to the analog-to-digital converter 8. The sensing magnetometers and the compression signal magnetometer sense a magnetic field in the same direction and are disposed at positions closer to each other than to the magnetic shield with an inner diameter of 800 mm so that the external field sensed by the sensing magnetometers and the compression signal measured by the compression signal magnetometer 69 have strong correlation therebetween.

Accordingly, fluctuations induced by the external field can be reduced by a factor of several to several tens by subtracting the compression signal measured by the compression signal magnetometer 69 from each of the measurement signals. The signal waveforms B(1, 1) and B(2, 1) shown in FIG. 6B are data on signals obtained by subtracting the compression signal measured by the compression signal magnetometer 69 from the measurement signals measured while a train is passing and accumulated by the computer through the 16-bit analog-to-digital converter. The accumulation of the measurement signals by the computer has been performed without allowing the width of a fluctuation in each of the measurement signals to exceed the input dynamic range of the analog-to-digital converter.

The two signal waveforms in the lower portion of FIG. 6B represent data on a difference between output signals from the two magnetometers X(1, 1) and the data Cx(1, 1) resulting from correction using the first reference signal. Since the signal measured by the compression signal magnetometer 69 according to the second embodiment is cancelled when the difference between the signals from the adjacent magnetometers is calculated, it is characterized by not remaining in the difference data.

By performing the correction in the same manner as in the first embodiment, the fluctuations induced by the external field, which are remaining in the difference data x(1, 1), have been removed as shown in the data Cx(1, 1) after the correction. It will therefore be understood that, even when the compression signal measured by the compression signal magnetometer 69 is inputted to the measurement circuit, the effect of reducing the external field is unaffected thereby in the second embodiment.

The foregoing result can prove that, even when the fluctuations of the external field are large, the measurement signal under less influence of the external field is obtainable.

Although the second embodiment has used the circuit structure of FIG. 4B as the measurement circuit, this structure is only exemplary. Various structures can be adopted for the place where the different amplifier circuit 79 is disposed. The same result is also achievable by, e.g., disposing a variable gain amplifier 80 for correcting the sensitivity of the magnetometers in the stage subsequent to the FLL circuit 6 and disposing an amplifier filter circuit not shown in the stage subsequent to the differential amplifier circuit 79, as shown in FIG. 4C.

Embodiment 3

When magnetocardiographic measurement was performed by using the system of the structure according to the first embodiment, it was proved that noise at a frequency of about several hertz remained in some cases depending on the place where the system is disposed.

Figure 7:
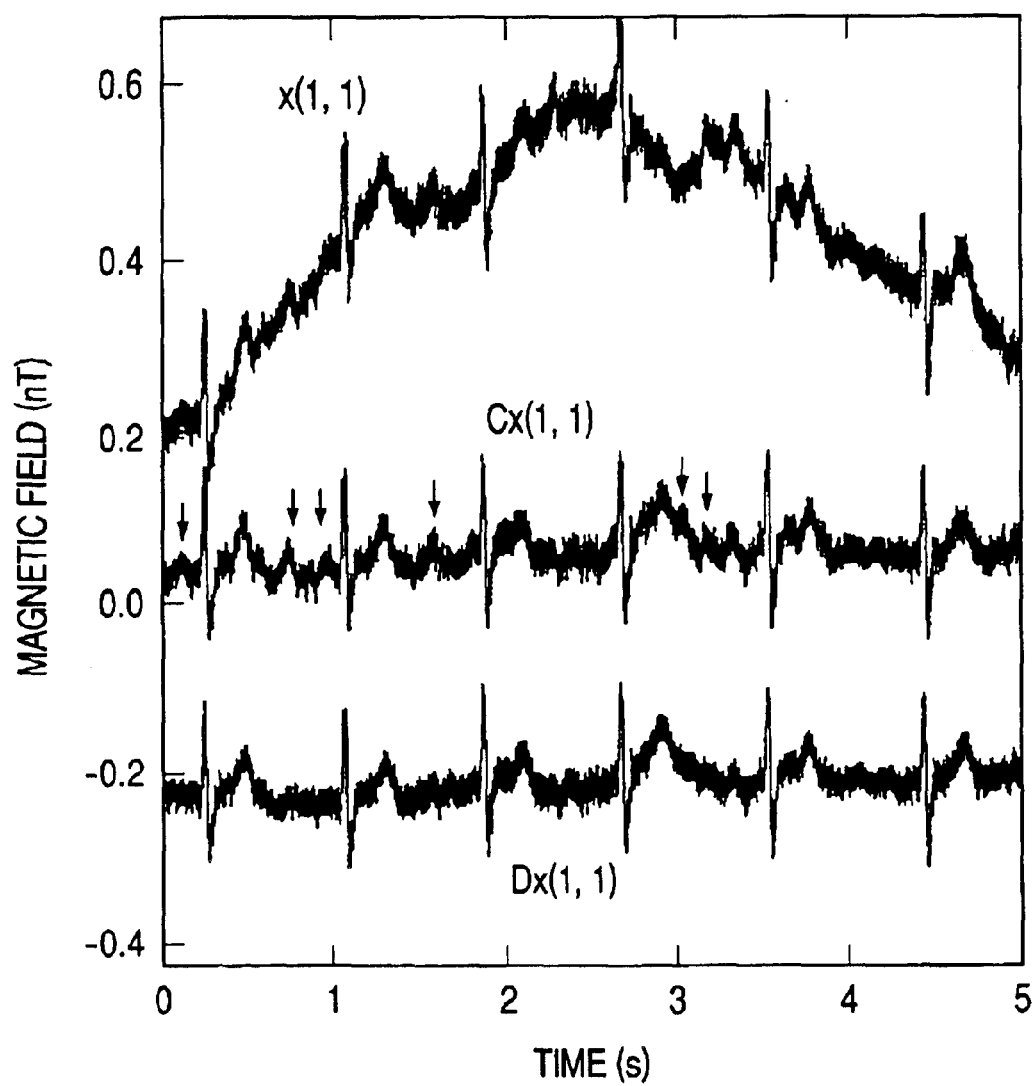
FIG. 7 is a view showing examples of magnetocardiograms obtained from measurement using a magnetic field measurement system according to a third embodiment of the present invention.

FIG. 7 is a view showing examples of magnetocardiograms obtained from measurement using the magnetic field measurement system according to a third embodiment of the present invention. The magnetic field signal in the uppermost portion of FIG. 7 represents the difference data X(1, 1) before external field correction was performed. The magnetic field signal in the middle portion of FIG. 7 represents the difference data Cx(1, 1) after correction using the first reference signal was performed. Although the large fluctuations induced by the external field have been removed by performing the correction using the first reference signal described in the first embodiment, a small oscillation component of about 5 Hz remains at each of the positions indicated by the arrows in FIG. 7. The mechanism of the occurrence of this small oscillation component has not been elucidated completely, but the vibration of a floor or the dewar may be considered to be a factor causing the small oscillation component. For the removal of the small oscillation component, the structure according to the third embodiment has been obtained by adding a second reference magnetometer to the structure of the magnetic field measurement system according to the first embodiment.

Figure 8A:
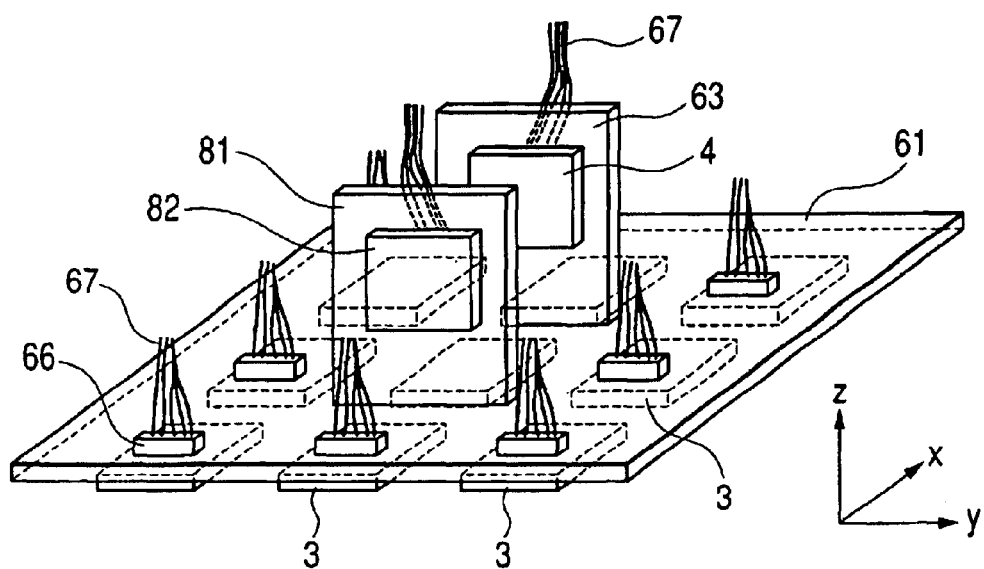
FIGS. 8A and 8B are views showing the arrangements of the magnetometers in the embodiments of the present invention.

FIG. 8A is a view showing the arrangement of magnetometers according the third embodiment of the present invention. FIG. 8A shows the arrangement of the magnetometers placed inside the dewar 2. The structure shown in FIG. 8A has been obtained by adding a second reference magnetometer 82 to the structure according to the first embodiment shown in FIG. 3A. The second reference magnetometer 82 has the same structure as the magnetometer shown in FIG. 2.

The second reference magnetometer 82 has been disposed on a plate 81 defining a fourth plane parallel to the plate 63 on which the first reference magnetometer 4 has been disposed. In the third embodiment, the spacing between the plates 63 and 81 has been adjusted to 40 mm. A second reference magnetometer 82 has been fixed to the plate 81 defining the fourth plane such that the center axis of the pickup coil of the first reference magnetometer 4 coincides with the center axis of the pickup coil of the second reference magnetometer 82.

In the third embodiment, the first and second reference magnetometers 4 and 82 constitute an axial first order gradiometer such that further noise correction is performed by using a signal from the first order gradiometer with respect to difference data after the correction using the first reference signal is performed. Specifically, measurement signals Dx(m, n) and Dy(m, n) (given by Numerical Expressions 36 and 37) are obtainable by subtracting values obtained by multiplying a difference between first and second reference signals by specified second correction factors from the difference data corrected by using the first reference signal.

$$Dx(m,n)=Cx(m,n)-\beta x(m,n)\cdot(B(ref,1)-B(ref,2))$$ Numerical Expression 36

$$Dy(m,n)=Cy(m,n)-\beta y(m,n)\cdot(B(ref,1)-B(ref,2))$$ Numerical Expression 37 where $\beta x(m, n)$ and $\beta y(m, n)$ are second correction factors and B(ref, 1) and B(ref, 2) are first and second reference signals sensed by the first and second reference magnetometers. As the second correction factors $\beta x(m, n)$ and $\beta y(m, n)$, values which minimize variations in the measurement signals are used selectively by least mean square fitting, similarly to the first correction factor. Although the third embodiment has performed analysis by using the predetermined second correction factors, it is also possible to determine the second correction factors for actual measurement signals every time measurement is performed.

Figure 9A:
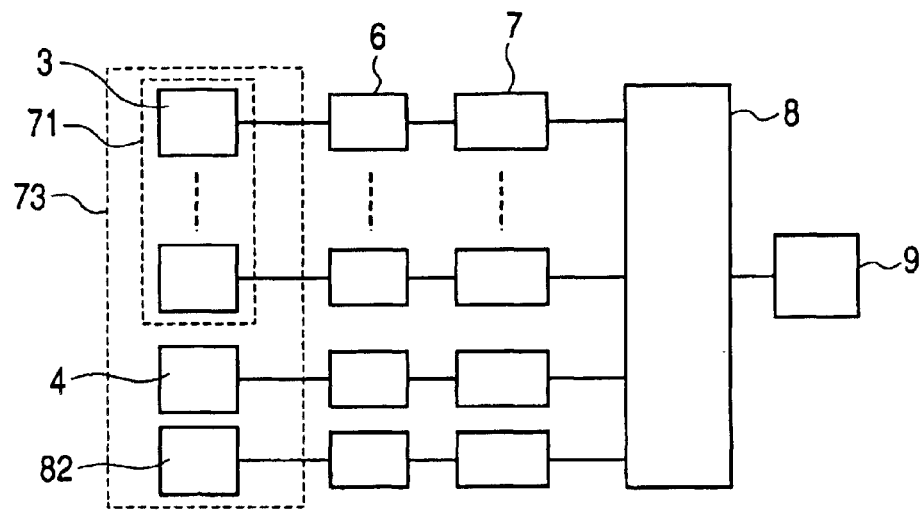
FIGS. 9A and 9B are views showing structures of measurement circuits in the embodiments of the present invention.

FIG. 9A is a view showing a structure of a measurement circuit according to the third embodiment.

The measurement circuit according to the third embodiment has a structure obtained by adding, to the circuit structure according to the first embodiment shown in FIG. 4A, the second reference magnetometer 82 and the FLL circuit 6 and the analog signal processing circuit 7 each corresponding thereto. The magnetic field signal data Dx(1, 1) in the lowermost portion of FIG. 7 was obtained as a result of performing correction by using the signal from the foregoing first order gradiometer after performing the correction using the first reference signal. The majority of fluctuations with a period of about 5 Hz, which could not be removed by the correction using the first reference signal, have been removed so that the effect of the third embodiment is recognizable.

Embodiment 4

Figure 8B:
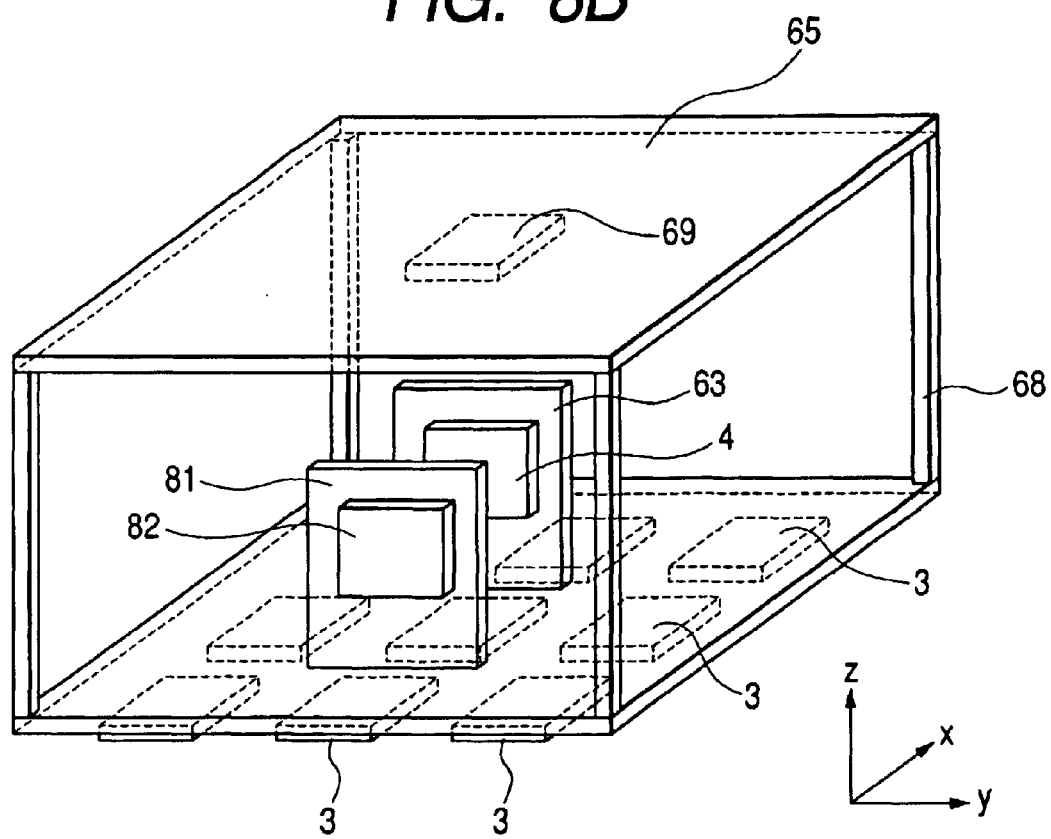

FIG. 8B is a view showing the arrangement of magnetometers according to a fourth embodiment of the present invention. FIG. 8B shows the arrangement of the magnetometers placed inside the dewar 2. The structure shown in FIG. 8B has been obtained by adding the compression signal magnetometer 69 to the structure according to the third embodiment described with reference to FIG. 8A. The compression signal magnetometer 69 has been mounted at the same position as in the second embodiment shown in FIG. 3B. The structure of the magnetic field measurement system according to the fourth embodiment has been obtained by adding the compression signal magnetometer 69 and the differential amplifier circuit 79, each described in the second embodiment, to the magnetic field measurement system according to the third embodiment. As described in the second embodiment, the use of the compression signal magnetometer 69 can prevent the measurement signal from exceeding the input dynamic range of the analog-to-digital converter.

Figure 9B:
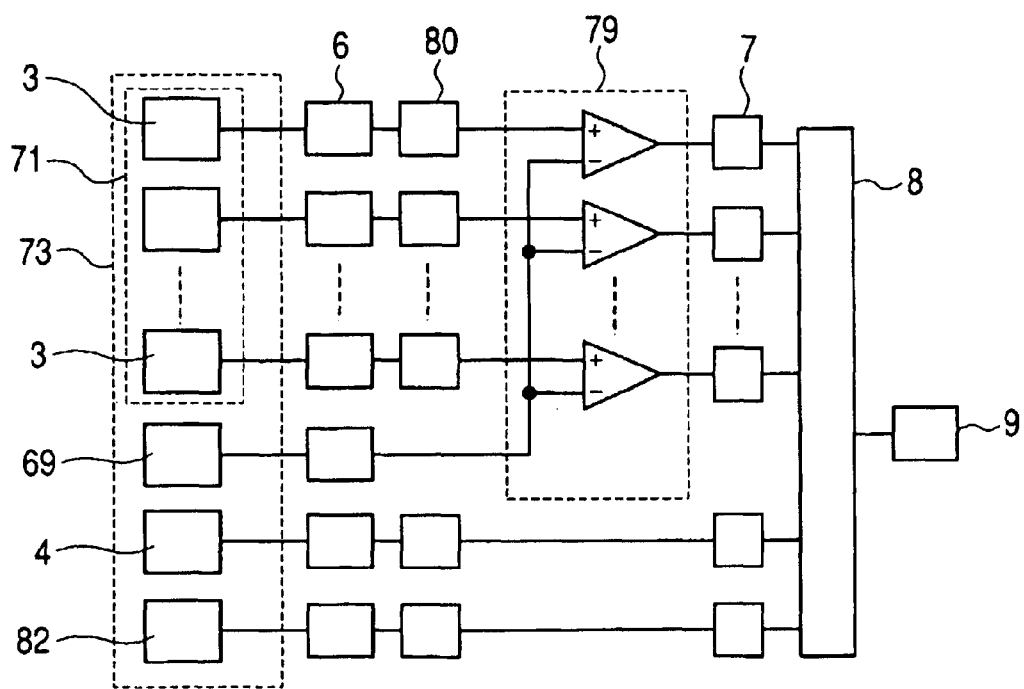

FIG. 9B is a view showing a structure of a measurement circuit according to the fourth embodiment. The measurement circuit according to the fourth embodiment has the structure obtained by adding, to the measurement circuit according to the third embodiment shown in FIG. 9A, the compression signal magnetometer 69 and the FLL circuit thereof such that the compression signal measured by the compression signal magnetometer 69 is subtracted from each of the measurement signals through the differential amplifier circuit 79 before the measurement signal is inputted to the analog-to-digital converter 8. In addition, the variable gain amplifier 80 has been inserted in a stage preceding the differential amplifier circuit. In the fourth embodiment, the sensitivities of the magnetometers were corrected by using the variable gain amplifier.

By thus adding the compression signal magnetometer 69, it becomes possible to prevent the measurement signal from exceeding the input dynamic range of the analog-to-digital converter in the same manner as in the second embodiment.

Although the fourth embodiment has used the circuit structure of FIG. 9B, this structure is only exemplary. Various structures can be adopted for the positions of the different amplifier circuit and the variable gain amplifiers.

Embodiment 5

As described in the third embodiment, there are cases where noise at a frequency of about several hertz remains depending on the place where the system is disposed. A fifth embodiment according to the present invention has examined correction using a first order gradiometer of a structure different from that in the third embodiment.

Figure 10A:
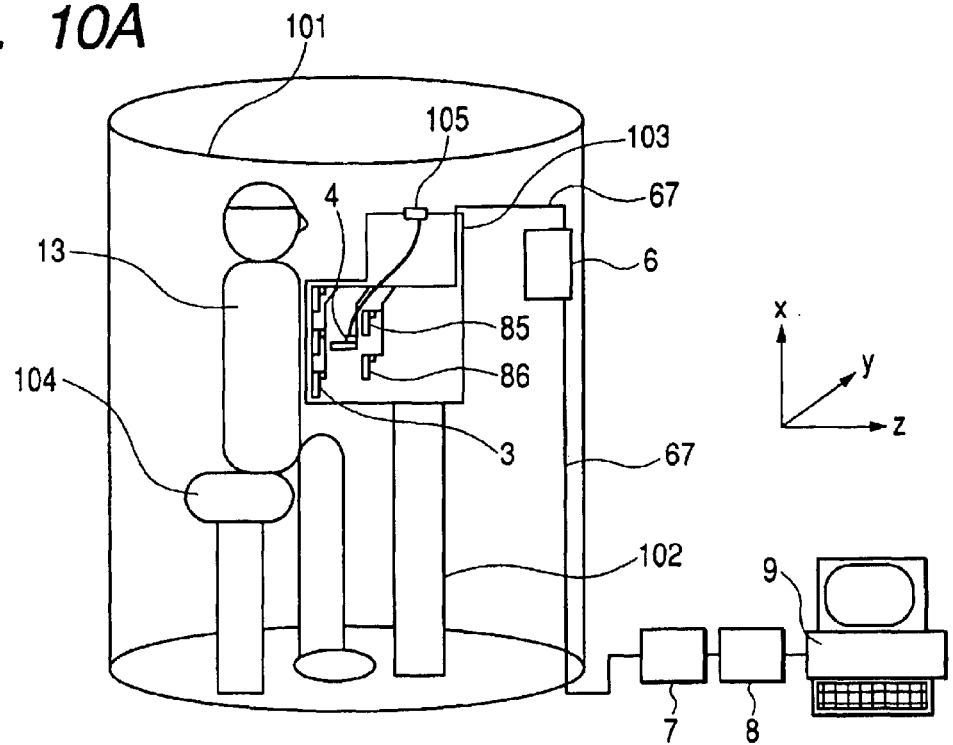
FIGS. 10A and 10B are views each showing a structure of a magnetic field measurement system according to a fifth embodiment of the present invention.
Figure 10B:
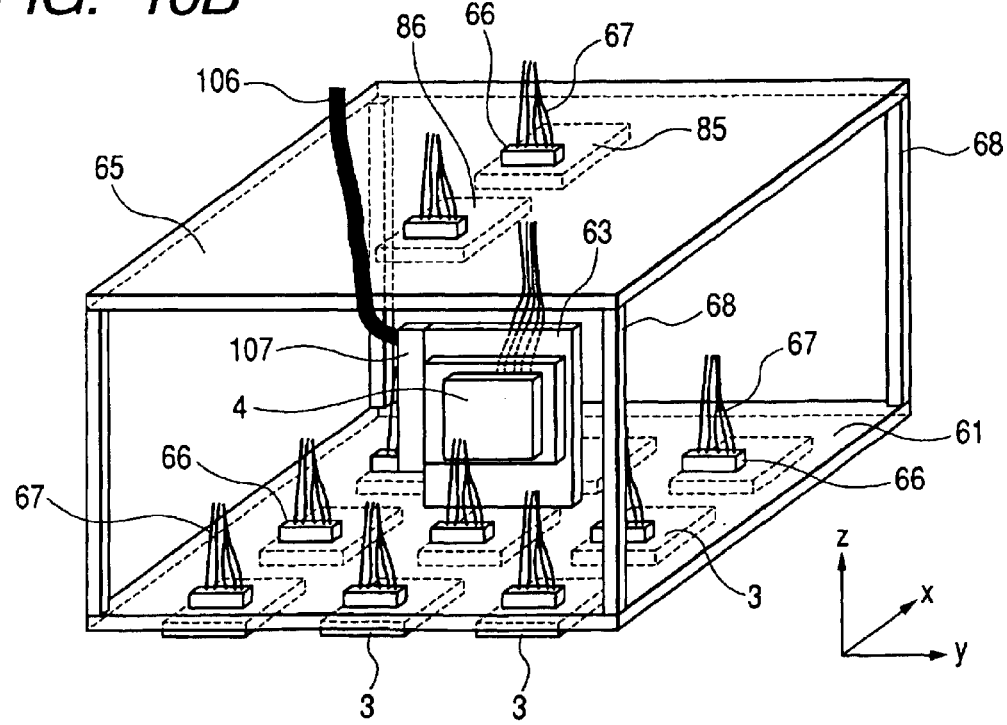

FIG. 10A is a view showing a structure of a magnetic field measurement system according to the fifth embodiment. FIG. 10B is view showing the arrangement of magnetometers in the fifth embodiment.

As shown in FIG. 10A, the fifth embodiment has used a vertically mounted cylindrical magnetic shield 101 disposed to have a center axis perpendicular to a floor surface. The subject 13 undergoes magnetocardiographic measurement in a posture lightly sitting on a chair 104 instead of lying on his or her back on a bed. The chair 104 and a dewar 103 fixed to a gantry 102 have a vertically moving mechanism so that the sensing magnetometers are aligned at an optimal position of the chest portion of the subject.

Each of the chair 104, the gantry 102, and the like is made of a nonmagnetic material. The dewar 103 made of ERP has an L-shaped configuration and the signal line 67 has been withdrawn from the upper portion thereof. The signal line is connected to the FLL circuit 6 mounted on the inner wall of the magnetic shield. A signal outputted from the FLL circuit 6 is connected to an amplifier filter unit 7 placed outside the magnetic shield through the signal line routed along the inner wall of the magnetic shield. The angle of the first magnetometer can be finely adjusted by rotating an angle adjustment lever 105 attached to the upper portion of the dewar 103.

FIG. 10B is a view showing the arrangement of magnetometers placed inside the dewar 103. The structure shown in FIG. 10B has been obtained by adding a third reference magnetometer 85, a fourth reference magnetometer 86, and an angle adjustment mechanism 107 for finely adjusting the orientation of the first reference magnetometer 4 to the structure according to the first embodiment described with reference to FIG. 3A. The third reference magnetometer 85 is disposed on the plate 65 parallel to the plate 61. The fourth reference magnetometer 86 is positioned in the x-direction at a distance of 30 mm from the third reference magnetometer 85.

The angle adjustment mechanism 107 is connected to the angle adjustment lever 105 via a wire 106 made of a nonmagnetic material. By rotating the angle adjustment lever 105, the plate 63 is rotated relative to the plate 61 so that the direction of the plane of the pickup coil of the first reference magnetometer 4 is finely adjusted.

By adjusting the angle of the first reference magnetometer 4 to maximize the external field sensed by the first reference magnetometer 4, i.e., the first reference signal, the first correction factor by which the first reference signal is multiplied is reduced to a smaller value. As a result, the influence of the intrinsic noise of the first reference magnetometer on the corrected data represented by Numerical Expression 31 is further reduced. The unit of the magnetometers shown in FIG. 10B is disposed such that the plate 63 defining the first plane on which the plurality of sensing magnetometers 3 are mounted is parallel to the center axis of the cylindrical magnetic shield shown in FIG. 10A.

In the fifth embodiment, the third and fourth reference magnetometers constitute a planar first order gradiometer such that further noise correction using a signal from the first order gradiometer is performed with respect to difference data after the correction using the first reference signal described in the first embodiment is performed. In short, the structure according to the fifth embodiment uses the planar first order gradiometer in place of the axial first order gradiometer used in the third embodiment.

As shown in Numerical Expressions 38 and 39, measurement signals Fx(m, n) and Fy(m, n) under much less influence of the external field are obtainable by subtracting a value obtained by multiplying a difference between third and fourth reference signals by given third correction factors from the difference data corrected by using the first reference signal. In the Numerical Expressions 38 and 39, $\gamma x(m, n)$ and $\gamma y(m, n)$ are the third correction factors and B(ref, 3) and B(ref, 4) are signals from the third and fourth reference magnetometers. As the third correction factors, values which minimize fluctuations in the measurement signals are used selectively by least mean square fitting, similarly to the first and second correction factors.

$Fx(m,n)=Cx(m,n)-\gamma x(m,n) \cdot (B(ref,3)-B(ref,4))$  Numerical Expression 38

$Fy(m, n)=Cy(m,n)-\gamma y(m,n) \cdot (B(ref,3)-B(ref,4))$  Numerical Expression 39

Figure 11A:
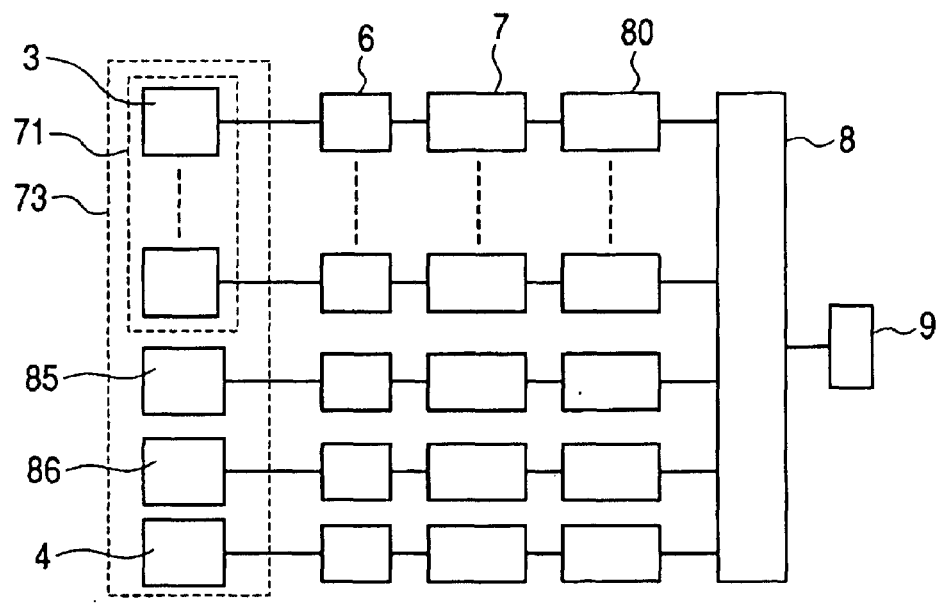
FIGS. 11A and 11B are views showing structures of measurement circuits in the embodiments of the present invention.

FIG. 11A is a view showing a structure of a measurement circuit according to the fifth embodiment of the present invention. The measurement circuit according to the fifth embodiment has the structure obtained by adding, to the circuit structure according to the first embodiment shown in FIG. 4A, the third and fourth reference magnetometers 85 and 86 and the FLL circuit 6 and the analog signal processing circuit 7 each corresponding thereto.

Figure 12:
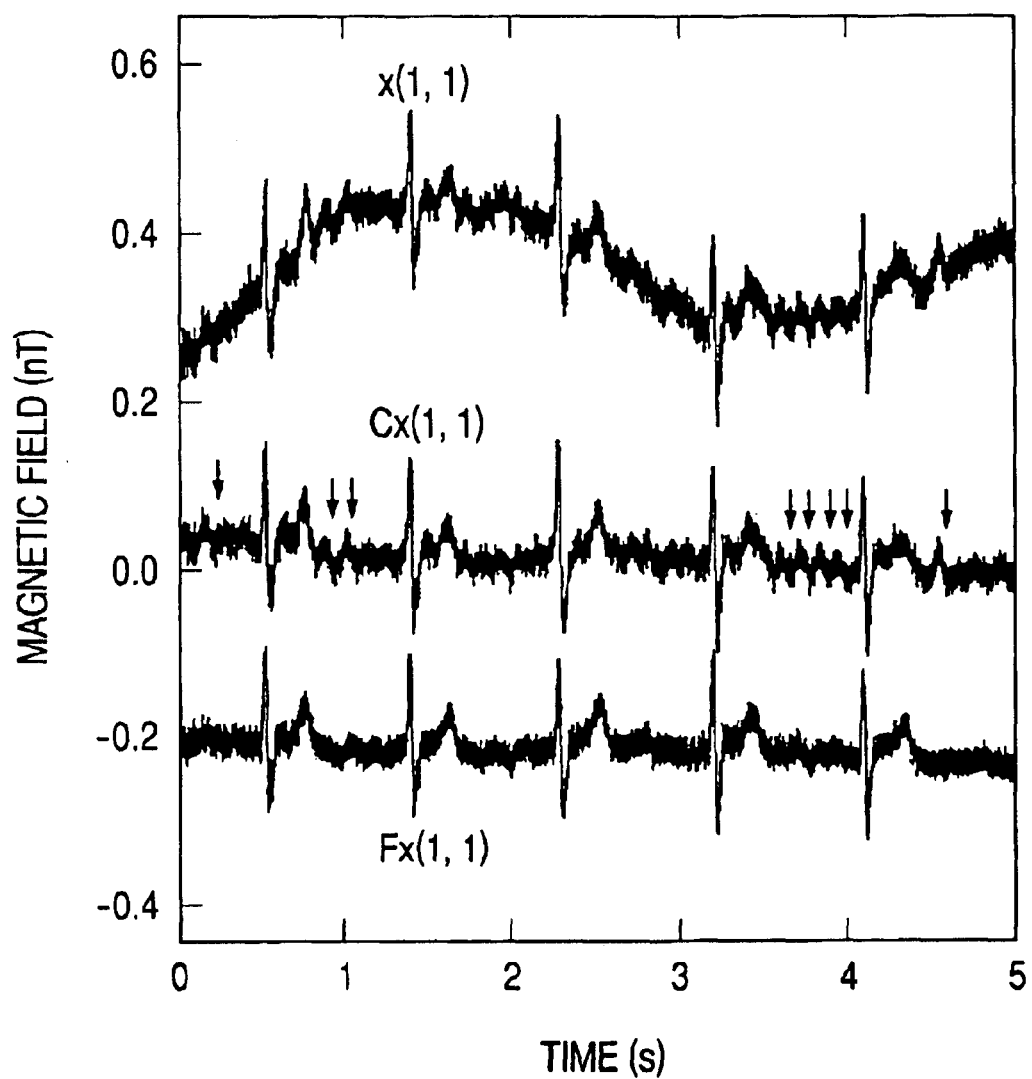
FIG. 12 is a view showing examples of magnetocardiograms obtained from measurement using the magnetic field measurement system according to the fifth embodiment.

FIG. 12 is a view showing examples of magnetocardiograms obtained from measurement using the magnetic field measurement system according to the fifth embodiment of the present invention. The magnetic field signal data in the uppermost portion of FIG. 12 indicates data X(1, 1) on a difference between the adjacent sensing magnetometers. In the difference data X(1, 1), the waveform has largely fluctuated due to the external field. The magnetic field signal data in the middle portion of FIG. 12 indicates the magnetic field signal Cx(1, 1) after correction using the first reference signal is performed. Although the large fluctuation component has been removed from the magnetic field signal Cx(1, 1), noise with a periodicity of about 8 Hz remains at each of the positions indicated by the arrows in FIG. 12. The magnetic field signal data in the lowermost portion of FIG. 12 indicates a magnetic field signal Fx(1, 1) resulting from subtracting a value obtained by multiplying the difference between the third and fourth reference signals by the given third factors from the magnetic field signal Cx(1, 1) (a waveform resulting from the correction using the first reference signal) in the middle portion of FIG. 12. It can be recognized that the majority of the noise with a periodicity of about 8 Hz has been removed.

Embodiment 6

A sixth embodiment shows an example in which the compression signal described in the second and fourth embodiment is used for the magnetic field measurement system according to the fifth embodiment. In contrast to the second and fourth embodiments in which the magnetometer for measuring a compression signal has been placed, the third and fourth reference magnetometers 85 and 86 are placed as magnetometers for sensing a magnetic field in the same direction as the sensing magnetometers in the same manner as in the structure according to the fifth embodiment shown in FIG. 10A. In the sixth embodiment, the measurement signal from the third reference magnetometer 85 is used as a compression signal. Accordingly, the arrangement of the magnetometers disposed inside the dewar 2 is the same as the arrangement thereof in the fifth embodiment shown in FIG. 10A.

Figure 11B:
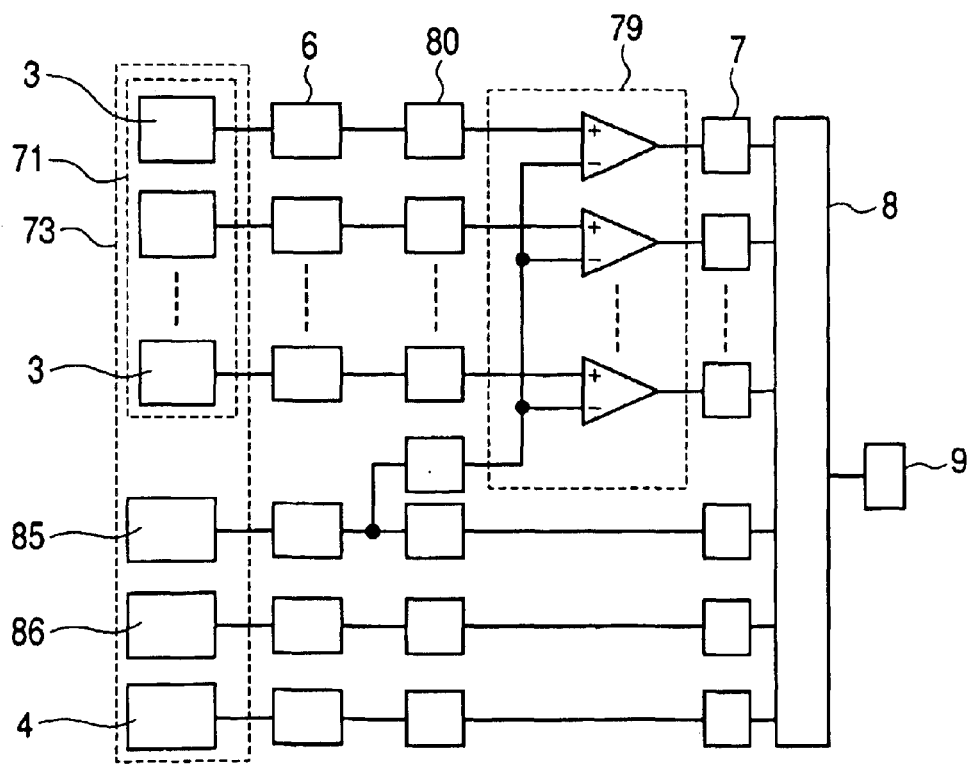

FIG. 11B is a view showing a structure of a measurement circuit according to the sixth embodiment of the present invention. By branching out the measurement signal from the third reference magnetometer 85 outputted from the FLL circuit 6 and connecting the branched measurement signal to the differential amplifier circuit 79, the measurement signal from the third reference magnetometer 85 can be used as a compression signal. As a result, a signal obtained by subtracting the measurement signal from the third reference magnetometer 85 from the output signal from each of the sensing magnetometers is processed by the analog-to-digital converter in the subsequent stage.

The structure according to the sixth embodiment also enables the measurement of a magneto-cardiogram without allowing a signal to exceed the dynamic range at the input portion of the analog-to-digital converter.

Embodiment 7

In a seventh embodiment, magnetocardiographic measurement was performed by using a magnetic field measurement system in which 36 sensing magneto-meters are arranged as a 6×6 array. The overall structure of the magnetic field measurement system according to the seventh embodiment is the same as that shown in FIG. 1, except that a large-scale dewar is used and four pairs of blocks each composed of the 3×3 array of sensing magnetometers, the first reference magnetometer, and the compression signal magnetometer used in the second embodiment shown in FIG. 3B are arranged as a 2×2 array.

Figure 13:
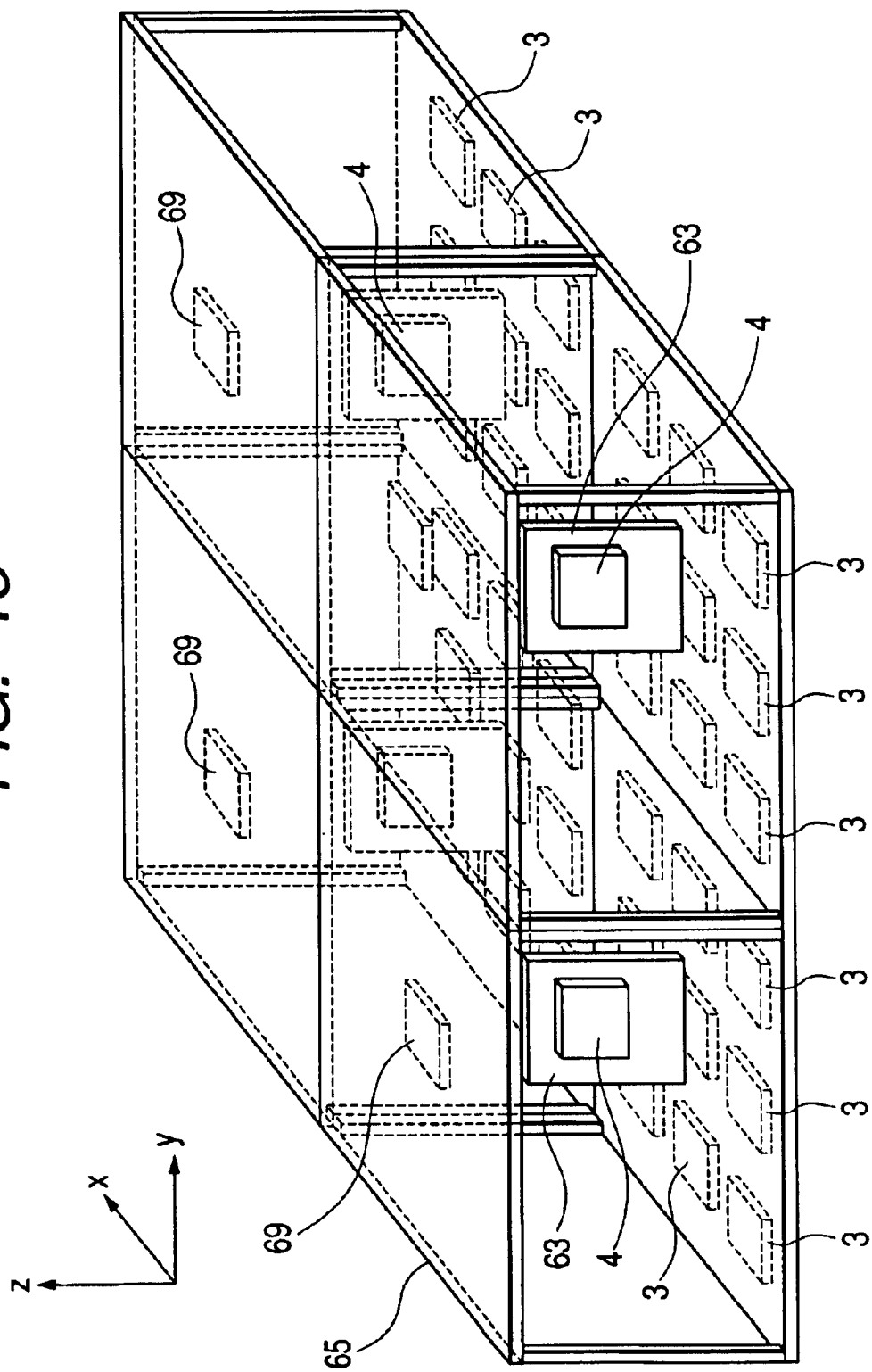
FIG. 13 is a view showing an example of the arrangement of sensing magnetometers in a seventh embodiment of the present invention.

FIG. 13 is a view showing an example of the arrangement of the sensing magnetometers in the seventh embodiment of the present invention, which shows the arrangement of the magnetometers placed inside the dewar 2. If data on a difference between measurement signals from the magnetometers in the same block is corrected, the first reference signal measured by the first magnetometer disposed in the same block is used. If the magnetometers between which a difference is to be calculated are disposed in two different blocks, an average value of the first reference signals in the two different blocks is used as a reference signal. As the compression signal magnetometer, one of the four compression signal magnetometers 69 is used. This is because, to completely cancel compression signals upon calculating the difference, it is necessary to use exactly the same compression signals. Although the seventh embodiment uses one of the compression signal magnetometers disposed at the respective centers of the blocks, the compression signal magnetometers may also be disposed at the center portion of the overall structure. The measurement circuit has a structure obtained by expanding the circuit of FIG. 4C by 4-fold. However, the compression signal magnetometers are in one system, as described above.

With the structure according to the seventh embodiment, a magnetocardiogram under less influence of the external field can be obtained by using the 6×6 array of sensing magnetometers in the same manner as shown in the result of the second embodiment.

Embodiment 8

In an eight embodiment, a magnetic field measurement system having the 6×6 array of sensing magnetometers used in the seventh embodiment was used. Since the intensity of a magnetocardiographic signal is dependent on the position, size, or the like of a heart, it differs greatly among individual subjects. Accordingly, there are cases where measurement cannot be performed with a sufficient S/N ratio when a peak (P-wave) generated by the activity of atria is weak. Although each of the first to seventh embodiments has calculated the difference between the two sensing magnetometers disposed in adjacent relation, if the S/N ratio is inferior and the P-wave cannot be measured properly, a distinct P-wave with an improved S/N ratio can be measured by calculating a difference between a sensing magnetometer and another sensing magnetometer positioned not adjacent thereto but at a larger distance therefrom.

Figure 14:
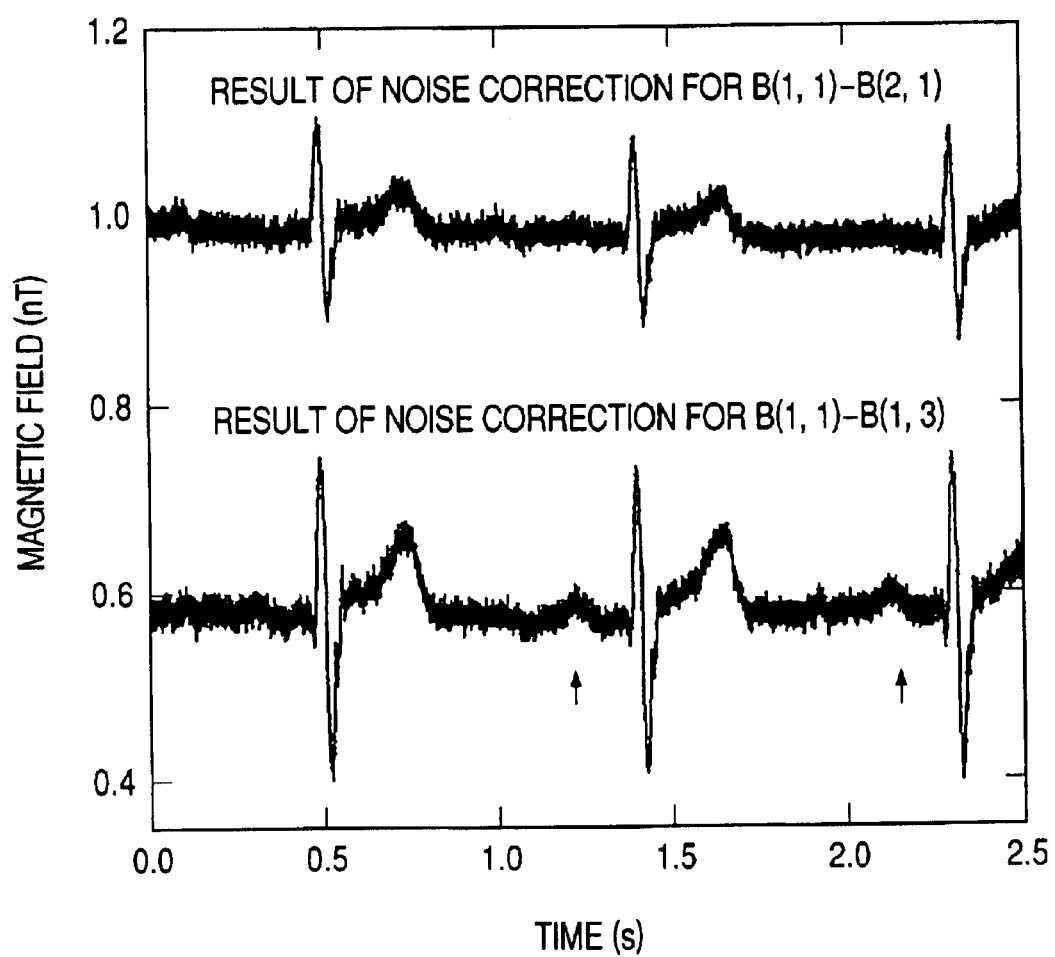
FIG. 14 is a view showing examples of magnetocardiograms obtained from measurement using a magnetic field measurement system according to an eighth embodiment of the present invention.

FIG. 14 is a view showing examples of magnetocardiograms measured by the magnetic field measurement system according to the eighth embodiment of the present invention. FIG. 14 shows the example of the magnetocardiogram measured between adjacent magnetometers (the SQUIDs (1, 1) and (2, 1) which are 30 mm spaced apart) (in the upper portion) and the lower portion of FIG. 14 shows the example of the magnetocardiogram measured between magnetometers at a larger distance from each other (the SQUIDs (1, 1) and (3, 1) which are 60 mm spaced apart) (in the lower portion).

Either of the upper and lower portions of FIG. 14 shows data after the removal of the external field so that the large fluctuation component resulting from the external field has been removed therefrom. In the drawing, the peak of the P-wave is observed at each of the portions indicated by the arrows in the magnetocardiogram (in the lower portion) measured by using the magnetometers (the SQUIDs (1, 1) and (3, 1) which are 60 mm spaced apart) at a larger distance from each other. Thus, the method for removing the external field according to the present invention is also applicable to a combination of magnetometers other than those adjacent to each other.

Figure 15A:
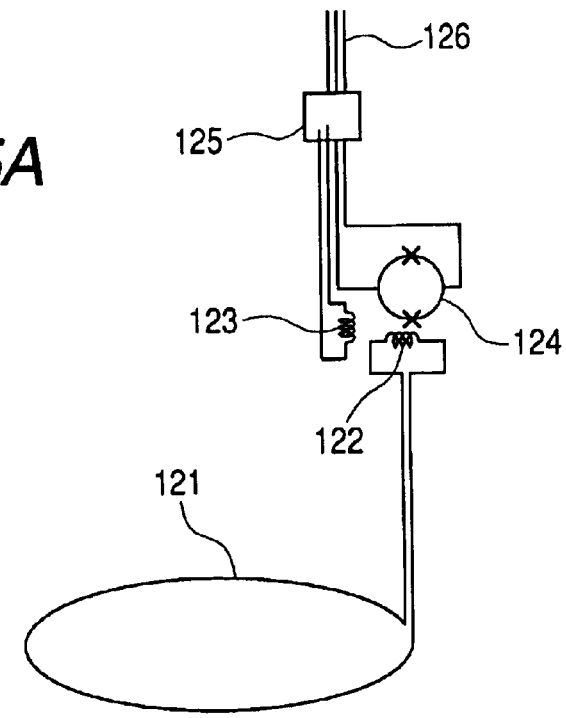
FIGS. 15A and 15B are views showing other structures of magnetometers to which the present invention is applicable.

Although each of the first to eight embodiments described above has used the directly coupled thin film magnetometer composed of a high critical temperature superconductor, a magnetometer composed of a low critical temperature superconductor may also be used instead. For example, there can be used a magnetometer composed of a niobium superconductor in which a pickup coil made of a Nb-Ti wire is connected to an input coil formed on a SQUID with an insulating film interposed therebetween in a thin-film multilayer process, as shown in FIG. 15A.

A shielding current proportional to a magnetic field flows in the magnetometric pickup coil 121. The shielding current is converted by an input coil 122 to a magnetic flux, which is transmitted to a SQUID 124. The SQUID 124 is a superconducting element for sensing the magnetic flux and converting the sensed magnetic flux to a voltage signal. A feedback magnetic flux for driving the SQUID 124 is supplied by a feedback coil 123. An FLL circuit 125 is an electronic circuit for controlling the SQUID 124 having a nonlinear output voltage signal and outputting the voltage signal proportional to the magnetic field sensed by the SQUID. The output signal from the FLL circuit 125 is transmitted to a signal processing circuit in a subsequent stage via a signal line 126.

Figure 15B:
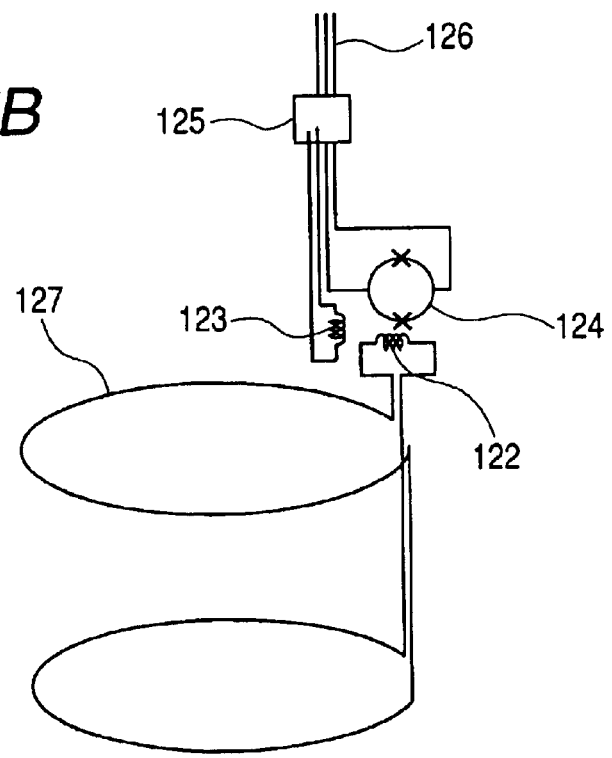

It is also possible to use an axial gradiometer equipped with a differential pickup coil shown in FIG. 15B as a sensing magnetometer. A first order gradiometric pickup coil 127 is used in which a shielding current proportional to a difference between magnetic fluxes interlinking two loops occupying equal areas. In the pickup coil 127, the shielding current proportional to the gradient of a magnetic field flows.

The magnetometers shown in FIGS. 15 are only exemplary and magnetometers of various structures can be used instead. As the magnetometer for measuring a compression signal, however, a magnetometer of the same structure as that of the sensing magnetometer is used suitably. As the first reference magnetometer for sensing the component of a magnetic field in the direction of the center axis of the cylindrical magnetic shield, a magnetometer is used more suitably than a gradiometer.

With the magnetic field measurement system according to the present invention, an extremely weak magnetic field can be sensed by using a simple cylindrical magnetic shield employing a small number of reference magnetometers and thereby performing efficient cancellation of an external field. Since the number of reference magnetometers is small, the system can be fabricated in a small circuit scale and at low cost.

What is claimed is:

1. A magnetic field measurement system comprising:
    a magnetically shielding device having a cylindrical magnetic shield composed of a ferromagnetic material;
    a plurality of sensing magnetometers having respective SQUIDs and respective pickup coils and arranged in two dimensions to sense a magnetic field component of a magnetic field emitted from a living body which is perpendicular to a center axis of said cylindrical magnetic shield;
    a first reference magnetometer having a SQUID and a pickup coil to sense a magnetic field component of an external field which is parallel to said center axis;
    a dewar for accommodating and cooling said plurality of sensing magnetometers and said first reference magnetometer, in which said plurality of sensing magnetometers are arranged in two dimensions on a first plane close to said center axis such that a plane of said pickup coils of said plurality of sensing magnetometers is parallel to said center axis and said reference magnetometer is positioned on a second plane perpendicular to said first plane in spaced apart relation to said first plane such that a plane of said pickup coil of said first reference magnetometer is perpendicular to said first plane;
    a gantry for holding said dewar internally of said cylindrical magnetic shield;
    a measurement circuit for driving said plurality of sensing magnetometers and said first reference magnetometer to sense said perpendicular magnetic field component and said parallel magnetic field component and outputting the sensed magnetic field components as measurement signals and a first reference signal;
    a device for recording said measurement signals; and
    an analyzing device for analyzing said measurement signals and displaying a result of analysis, wherein
    said analyzing device performs an arithmetic operation of subtracting a value obtained by multiplying said first reference signal sensed by said first reference magnetometer by a first specified factor from a difference between said measurement signals sensed by two of said sensing magneto-meters disposed at different positions to determine a first corrected measurement signal under less influence of said external field.

2. A magnetic field measurement system according to claim 1, further comprising:
    a magnetometer for measuring a dynamic range compression signal which has a SQUID and a pickup coil and is disposed on a third plane parallel to said first plane and positioned at a larger distance from the center axis of said cylindrical magnetic shield than said first plane to sense a magnetic field component of said external field which is perpendicular to said center axis, wherein
    the measurement circuit drives said magnetometer for measuring a dynamic range compression signal to sense said perpendicular magnetic field component and outputs the sensed magnetic field component as a dynamic range compression signal, said magnetic field measurement system further comprising:
    a differential amplifier circuit for subtracting said dynamic range compression signal from each of the measurement signals from said plurality of sensing magnetometers and outputting the measurement signals from said sensing magnetometers each having a compressed dynamic range, wherein
    said recording device records the measurement signals from said plurality of sensing magneto-meters each having the compressed dynamic range and the measurement signal from the reference magnetometer and
    said analyzing device performs an arithmetic operation of subtracting the value obtained by multiplying said reference signal sensed by said reference magnetometer by the first specified factor from a difference between the measurement signals from said sensing magnetometers each having the compressed dynamic range to determine the first corrected measurement signal under less influence of said external field.

3. A magnetic field measurement system according to claim 1, wherein
   said plurality of sensing magnetometers are divided into a plurality of blocks,
   said first reference magnetometer is disposed for each of said blocks, and
   said analyzing device determines the first corrected measurement signal under less influence of said external field for each of said blocks.

4. A magnetic field measurement system according to claim 2, wherein
   said plurality of sensing magnetometers are divided into a plurality of blocks,
   said first reference magnetometer is disposed for each of said blocks, and
   said analyzing device determines the first corrected measurement signal under less influence of said external field for each of said blocks.

5. A magnetic field measurement system comprising:
   a magnetically shielding device having a cylindrical magnetic shield composed of a ferromagnetic material;
   a plurality of sensing magnetometers having respective SQUIDs and respective pickup coils and arranged in two dimensions to sense a magnetic field component of a magnetic field emitted from a living body which is perpendicular to a center axis of said cylindrical magnetic shield;
   first and second reference magnetometers having respective SQUIDs and respective pickup coils to sense a magnetic field component of an external field which is parallel to said center axis;
   a dewar for accommodating and cooling said plurality of sensing magnetometers and said first and second reference magnetometers, in which said plurality of sensing magneto-meters are arranged in two dimensions on a first plane close to said center axis such that a plane of said pickup coils of said plurality of sensing magnetometers is parallel to said center axis, said first reference magnetometer is positioned on a second plane perpendicular to said first plane in spaced apart relation to said first plane such that a plane of said pickup coil of said first reference magnetometer is perpendicular to said first plane, and said second reference magnetometer is disposed on a fourth plane in parallel and spaced apart relation to said second plane such that a center axis of said pickup coil of said second reference magnetometer coincides with a center axis of said pickup coil of said first reference magnetometer;
   a gantry for holding said dewar internally of said cylindrical magnetic shield;
   a measurement circuit for driving said plurality of sensing magnetometers and said first and second reference magnetometers to sense said perpendicular magnetic field component and said parallel magnetic field component and outputting the sensed magnetic field components as measurement signals and first and second reference signals;
   a device for recording said measurement signals and the reference signals; and
   an analyzing device for analyzing said measurement signals and displaying a result of analysis, wherein
   said analyzing device performs an arithmetic operation of subtracting a value obtained by multiplying said first reference signal sensed by said first reference magnetometer by a first specified factor from a difference between said measurement signals sensed by two of said sensing magneto-meters disposed at different positions to determine a first corrected measurement signal and subtracting, from said first corrected measurement signal, a value obtained by multiplying a difference between said first and second reference signals by a second specified factor to determine a second corrected measurement signal under less influence of said external field.

6. A magnetic field measurement system according to claim 5, further comprising:
   a magnetometer for measuring a dynamic range compression signal which has a SQUID and a pickup coil and is disposed on a third plane parallel to said first plane and positioned at a larger distance from the center axis of said cylindrical magnetic shield than said first plane to sense a magnetic field component of the external field which is perpendicular to said center axis, wherein
   the measurement circuit drives said magnetometer for measuring a dynamic range compression signal to sense said perpendicular magnetic field component and outputs the sensed magnetic field component as a dynamic range compression signal, said magnetic field measurement system further comprising:
   a differential amplifier circuit for subtracting said dynamic range compression signal from each of the measurement signals from said plurality of sensing magnetometers, wherein
   said recording device records the compressed measurement signals after said dynamic range compression signals is subtracted from each of the measurement signals from said plurality of sensing magnetometers and said first and second reference signals and
   said analyzing device performs an arithmetic operation of subtracting the value obtained by multiplying said reference first signal sensed by said first reference magnetometer by the first specified factor from a difference between the measurement signals from said different sensing magnetometers each having the compressed dynamic range to determine the first corrected measurement signal under less influence of said external field and subtracting, from said first corrected measurement signal, the value obtained by multiplying the difference between said first and second reference signals by the second specified factor to determine the second corrected measurement signal under less influence of said external field.

7. A magnetic field measurement system according to claim 5, wherein
   said plurality of sensing magnetometers are divided into a plurality of blocks,
   said first and second reference magnetometer are disposed for each of said blocks, and
   said analyzing device determines the second corrected measurement signal under less influence of said external field for each of said blocks.

8. A magnetic field measurement system according to claim 6, wherein
   said plurality of sensing magnetometers are divided into a plurality of blocks,
   said first and second reference magnetometer are disposed for each of said blocks, and
   said analyzing device determines the second corrected measurement signal under less influence of said external field for each of said blocks.

9. A magnetic field measurement system comprising:

a magnetically shielding device having a cylindrical magnetic shield composed of a ferromagnetic material;

a plurality of sensing magnetometers having respective SQUIDs and respective pickup coils and arranged in two dimensions to sense a magnetic field component of a magnetic field emitted from a living body which is perpendicular to a center axis of said cylindrical magnetic shield;

a first reference magnetometer having a SQUID and a pickup coil to sense a magnetic field component of an external field which is parallel to said center axis;

third and fourth reference magnetometers having respective SQUIDs and respective pickup coils to sense a magnetic field component of the external field which is perpendicular to said center axis;

a dewar for accommodating and cooling said plurality of sensing magnetometers and said first, third, and fourth reference magnetometers, in which said plurality of sensing magnetometers are arranged in two dimensions on a first plane close to said center axis such that a plane of said pickup coils of said plurality of sensing magnetometers is parallel to said center axis, said first reference magnetometer is positioned on a second plane perpendicular to said first plane in spaced apart relation to said center axis such that a plane of said pickup coil of said first reference magnetometer is perpendicular to said first plane, and said third and fourth reference magnetometers are disposed on a third plane in parallel relation to said first plane and in spaced apart relation to said center axis such that a plane of the pickup coils of said third and fourth reference magnetometers is parallel to said third plane and that said fourth reference magnetometer is positioned at a larger distance than said third reference magnetometer in a direction of said center axis of said cylindrical magnetic shield;

a gantry for holding said dewar internally of said cylindrical magnetic shield;

a measurement circuit for driving said plurality of sensing magnetometers and said first, third, and fourth reference magnetometers to sense said perpendicular magnetic field component and said parallel magnetic field component and outputting the sensed magnetic field components as measurement signals and first, third, and fourth reference signals;

a device for recording said measurement signals and said first, third, and fourth reference signals; and an analyzing device for analyzing the recorded signals and displaying a result of analysis, wherein said analyzing device performs an arithmetic operation of subtracting a value obtained by multiplying said first reference signal by a first specified factor from a difference between said measurement signals sensed by two of said sensing magnetometers disposed at different positions to determine a first corrected measurement signal and subtracting, from said first measurement signal, a value obtained by multiplying a difference between said respective measurement signals sensed by said third and fourth magnetometers by a third specified factor to determine a third corrected measurement signal under less influence of said external field.

10. A magnetic field measurement system according to claim 9, further comprising:

a differential amplifier circuit for subtracting the measurement signal from said third reference magnetometer from each of the measurement signals from said plurality of sensing magnetometers, wherein said recording device records the measurement signals from said plurality of sensing magneto-meters from each of which the measurement signal from said third reference magnetometer has been subtracted to have a compressed dynamic range and said analyzing device performs an arithmetic operation of subtracting the value obtained by multiplying said first reference signal sensed by said first magnetometer by the first specified factor from a difference between the measurement signals from the different sensing magnetometers from each of which the measurement signal from said third reference magnetometer has been subtracted to have said compressed dynamic range to determine the first corrected measurement signal and subtracting, from said first measurement signal, the value obtained by multiplying the difference between said third and fourth reference signals by the third specified factor to determine the third corrected measurement signal under less influence of said external field.

11. A magnetic field measurement system according to claim 9, wherein said plurality of sensing magnetometers are divided into a plurality of blocks, said first, third, and fourth reference magnetometers are disposed for each of said blocks, and said analyzing device determines the third corrected measurement signal under less influence of said external field for each of said blocks.

12. A magnetic field measurement system according to claim 10, wherein said plurality of sensing magnetometers are divided into a plurality of blocks, said first, third, and fourth reference magnetometers are disposed for each of said blocks, and said analyzing device determines the third corrected measurement signal under less influence of said external field for each of said blocks.

* * * * *